United States Patent
Niuya et al.

(10) Patent No.: US 6,478,035 B1
(45) Date of Patent: Nov. 12, 2002

(54) CLEANING DEVICE, CLEANING SYSTEM, TREATING DEVICE AND CLEANING METHOD

(75) Inventors: Takayuki Niuya, Minato-Ku (JP); Michihiro Ono, Singapore (SG); Hideto Gotoh, Minato-Ku (JP); Hiroyuki Mori, Nirasaki (JP)

(73) Assignee: Tokyo Electron Limited, Tokyo-to (JP)

(*) Notice: Subject to any disclaimer, the term of this patent is extended or adjusted under 35 U.S.C. 154(b) by 59 days.

(21) Appl. No.: 09/634,005

(22) Filed: Aug. 7, 2000

(30) Foreign Application Priority Data

Aug. 5, 1999 (JP) .................................. 11-223109

(51) Int. Cl.$^7$ .............................. B08B 3/04; B08B 3/12
(52) U.S. Cl. ...................... 134/95.2; 134/133; 134/182; 134/186; 134/902
(58) Field of Search .................... 134/902, 61, 95.2, 134/99.1, 104.1, 133, 182, 184, 186

(56) References Cited

U.S. PATENT DOCUMENTS 4,917,123 A * 4/1990 McConnell et al. .... 134/902 X
5,379,785 A * 1/1995 Ohmori et al. ............. 134/184
5,579,792 A * 12/1996 Stanasolovich et al. . 134/902 X
5,709,235 A * 1/1998 Akanuma et al. ....... 134/902 X

FOREIGN PATENT DOCUMENTS

JP              212421    *  8/1992  ................. 134/902

* cited by examiner

Primary Examiner—Philip Coe
(74) Attorney, Agent, or Firm—Finnegan, Henderson, Farabow, Garrett & Dunner LLP

(57) ABSTRACT

There is provided a cleaning device capable of preventing a metal wiring layer or the like of an object to be treated, from being oxidized. The cleaning device comprises: a cleaning container 72 having a treating space S having a slightly larger volume than that of an object W to be treated; a fluid storage tank 30 for storing a cleaning fluid 32 for treating the object; supply lines 46A through 46D for supplying the cleaning fluid from the fluid storage tank to the cleaning container; and reflux lines 47A through 47D for returning the cleaning fluid from the cleaning container to the fluid storage tank, wherein the cleaning container, the fluid storage tank, the supply lines and the reflux lines are associated with each other for forming closed cleaning fluid circulating lines 51A through 51D. Thus, it is possible to prevent the metal wiring layer or the like of the object from being oxidized.

14 Claims, 14 Drawing Sheets

CLEANING DEVICE, CLEANING SYSTEM, TREATING DEVICE AND CLEANING METHOD

BACKGROUND OF THE INVENTION

1. Field of the Invention

The present invention relates generally to a cleaning device, cleaning system, treating device and cleaning method for removing deposits adhering to the surface of a semiconductor wafer or the like.

2. Description of Related Background Art

In general, in order to form a semiconductor integrated circuit or the like, various treatments, such as thin-film deposition on a semiconductor wafer, oxidation, diffusion and etching, are repeatedly carried out. In this case, for example, before the above described treatments are carried out, a cleaning treatment for removing organic substances, metal impurities, particles, natural oxide films and so forth, which adhere to the surface of a wafer, is carried out if necessary. In addition, although resist masks, side-wall protection layers for enhancing anisotropy and so forth are used when oxide films and so forth are etched in order to form wiring patterns and holes, these resist masks and so forth are also removed by a cleaning treatment or some treatment in the subsequent process. For example, when a desired wiring pattern is formed on a semiconductor wafer in this etching process, a resist 4 is first applied on the top face of an interlayer dielectric film 2 of, e.g., $SiO_2$, as a film of a semiconductor wafer to be etched, and this is patterned by a typical exposure technique to form a mask 6, as shown in FIG. 10(A). Furthermore, reference number 8 denotes a metal wiring layer of, e.g., copper or aluminum.

Then, as shown in FIG. 10(B), the resist mask 6 is used as a mask to scrape the interlayer dielectric film 2 by means of the dry etching using plasma or the like, to expose the metal wiring layer 8 underlying the interlayer dielectric film 2 to form a desired pattern. In this case, in order to prevent the broadening of etching in lateral directions to enhance anisotropy of the etching, a side-wall protection layer 10, which is produced by the reaction of etching gas, the shavings of the interlayer dielectric film 2 or the resists peeled off by the etching, is positively formed on the side walls of the interlayer dielectric film 2 with the progress of the etching.

The etching treatment is thus completed, $O_2$ is then introduced to ash and remove the undesired resist mask 6 by the plasma ashing treatment as shown in FIG. 10(C). Thereafter, the side-wall protection layer is also removed by the wet cleaning or the like.

By the way, the above described wet cleaning is carried out generally by completely immersing a plurality of semiconductor wafers, which are objects to be treated, in a storage tank filled with a cleaning solution, such as a chemical, at a time, or as shown in FIG. 11, by clamping a semiconductor wafer W on a turntable 12 to supply a cleaning solution 16, such as a chemical or a rinsing fluid (e.g., ultrapure water), in the form of liquid or spray from a nozzle 14 while rotating the turntable 12, to diffuse the cleaning solution 16 on the surface of the wafer W by centrifugal force. In addition, drying is also carried out while the wafer W is rotating.

By the way, in the above described cleaning device, there are some cases where the wafer is exposed to atmosphere during cleaning to oxidize the metal wiring layer and so forth on the surface thereof or to oxidize the metal wiring layer by oxygen and so forth mixed in the cleaning solution. In addition, in the above described method for immersing the wafer in the storage tank, there are some cases where the flow velocity of the cleaning fluid on the surface of the wafer is very low, so that cleaning can not sufficiently carried out.

In addition, when the cleaning solution is supplied to the central portion of the rotating wafer, the angular velocity increases from the central portion of the wafer to the peripheral portion thereof, so that the velocity distribution is ununiform. Therefore, there are some cases where the cleaning and drying of the central portion of a low angular velocity are insufficient, so that the inplane uniformity of the cleaning and drying treatments is damaged. In particular, when the temperature control for the chemical is severe, there is a problem in that the temperature of the chemical decreases toward the peripheral portion of the wafer.

In addition, in the case of the above described system for rotating the turntable 12, it is required to provide a rotating mechanism, so that the size of the system increases. As a result, it is difficult to stack a plurality of stages of such large systems, so that the systems must be flatted. Therefore, there is a problem in that the foot print increases when the number of cleaning treatment parts increases.

Moreover, when the metal film 8 having the structure shown in FIG. 10 is a copper film formed by the Cu metal damascene technique, there is a problem in that the copper film is oxidized during the $O_2$ plasma ashing, so that its electric characteristics deteriorate. Therefore, it is strongly desired to provide a cleaning method or cleaning device capable of rapidly removing the resist mask 6 and the side-wall protection layer 10 without the need of the $O_2$ plasma ashing.

In addition, since the treating atmosphere is not closed in the conventional immersion type and spin type cleaning systems, there is a problem in that the composition of the cleaning liquid is varied by vaporization of volatile constituents in the cleaning fluid and the metal wiring layer, particularly the copper wiring layer, is oxidized due to oxygen in the atmosphere in the treating chamber.

SUMMARY OF THE INVENTION

It is therefore an object of the present invention to eliminate the aforementioned problems and to provide a cleaning device, cleaning system and cleaning method capable of preventing a metal wiring layer or the like of an object to be treated, from being oxidized.

It is another object of the present invention to provide a cleaning device, cleaning system and cleaning method capable of rapidly and efficiently carrying out cleaning by using a cleaning fluid having a high flow velocity.

In order to accomplish the aforementioned and other objects, according to one aspect of the present invention, a cleaning device comprises: a cleaning container, in which a treating space for housing an object to be treated is formed; a fluid storage tank for storing a cleaning fluid for treating the object; a supply line for supplying the cleaning fluid from the fluid storage tank to the cleaning container; and a reflux line for returning the cleaning fluid from the cleaning container to the fluid storage tank, wherein the cleaning container, the fluid storage tank, the supply line and the reflux line are associated with each other for forming a closed cleaning fluid circulating line, and wherein a cross-sectional area of the treating space perpendicular to a direction from the supply line to the reflux line is predetermined times as large as the maximum value of the cross sectional area of the object perpendicular to the direction.

According to this device, when the cleaning fluid is allowed to flow through the cleaning container to clean the surface of the object to be treated, it is possible to rapidly and efficiently carry out the cleaning treatment without exposing the cleaning fluid to outside air. In addition, since air does not enter the treating container, it is possible to prevent a cleaned metal wiring layer, such as a copper film, from being oxidized. In other words, it is possible to efficiently use the cleaning fluid by circulating the cleaning fluid, and it is possible to prevent the cleaning fluid from being deteriorated due to oxidation and vaporization since the cleaning fluid is used in the closed state without contacting air.

The cleaning device may further comprise a recovering fluid supply system for supplying a recovering fluid to the cleaning container without exposing the recovering fluid to outside air, to recover the cleaning fluid in the fluid storage tank. Thus, it is possible to efficiently use the cleaning fluid.

The cleaning device may further comprise: a rinsing fluid supply system for supplying a rinsing fluid to the cleaning container without exposing the rinsing fluid to outside air; a dry fluid supply system for supplying a dry fluid to the cleaning container without exposing the dry fluid to outside air; and supply control means for controlling so as to selectively continuously supply one of the fluids to the cleaning container every kind of the fluids. Thus, it is possible to continuously carry out the rinsing and drying of the object in the same device.

The cleaning device may further comprise a second fluid storage tank for storing a residual liquid treating cleaning fluid for treating a residual liquid remaining in the cleaning fluid circulating line, and wherein a closed residual liquid treating/circulating line for allowing the residual liquid treating cleaning fluid to flow through the cleaning fluid circulating line without exposing the residual liquid treating cleaning fluid to outside air, to recover the residual liquid treating cleaning fluid in the second fluid storage tank is formed. Thus, it is possible to prevent the presence of the residual liquid remaining in the piping at the last step from having the influence on the next step even if the cleaning fluid circulating line is formed as a circulating line.

The fluid storage tank may comprise a plurality of storage tanks for storing cleaning fluids corresponding to a plurality of kinds of deposits, respectively, which adhere to the surface of the object to be treated. Thus, cleaning fluids having different functions can be supplied into the cleaning device without being mixed with each other to continuously carry out treatments, e.g., to continuously clean and remove a resist mask and side-wall protection layer on the surface of a semiconductor wafer after plasma etching.

The object may be a plate, and the cleaning device may further comprise fluid guiding means for allowing the cleaning fluid to flow in parallel to the surface of the plate. Thus, it is possible to allow the cleaning fluid to flow to uniformly carry out the treatment.

If the cleaning device has turbulent flow forming means for promoting a turbulent flow in the cleaning fluid, it is possible to reduce the influence of an immobile layer, which is produced on the surface of the object due to the viscosity of the chemical by the turbulent flow, to rapidly and efficiently carry out the cleaning treatment.

The turbulent flow forming means may comprise a sound wave radiating unit for irradiating the surface of the object with sound waves.

The sound wave radiating unit may comprise an ultrasonic element for producing ultrasonic waves, and a buffer tank for efficiently propagating the ultrasonic waves produced by the ultrasonic element.

The turbulent flow forming means may comprise an irregular portion provided on an inner wall surface of the cleaning container.

A plurality of cleaning devices, each of which is the same as the above described cleaning device, may be arranged in one of vertical, lateral and longitudinal directions. Thus, it is possible to reduce the occupied floor area to greatly reduce the foot print.

According to another aspect of the present invention, a treating device comprises: a transfer chamber capable of being maintained air-tightly; a load-lock chamber which is air-tightly connected to the transfer chamber for introducing/discharging an object to be treated, into/from the outside; at least one vacuum treating chamber which is air-tightly connected to the transfer chamber via a transfer port; a cleaning chamber which is air-tightly connected to the transfer chamber via a transfer port; transfer means, provided in the transfer chamber, for transferring the object between the load-lock chamber, the vacuum treating chamber and the cleaning device, the cleaning device comprising: a cleaning container, in which a treating space having a volume predetermined times as large as that of an object to be treated is formed; a fluid storage tank for storing a cleaning fluid for treating the object; a supply line for supplying the cleaning fluid from the fluid storage tank to the cleaning container; and a reflux line for returning the cleaning fluid from the cleaning container to the fluid storage tank, wherein the cleaning container, the fluid storage tank, the supply line and the reflux line are associated with each other for forming a closed cleaning fluid circulating line. If the cleaning device having the closed cleaning fluid circulating line is combined with the vacuum treating device and so forth in the form of a cluster, it is possible to carry out a series of consistent treating steps including a cleaning step without exposing the wafer W to outside air.

According to a further aspect of the present invention, there is provided a cleaning method wherein a cleaning fluid is supplied from a fluid storage tank for housing therein the cleaning fluid, to a cleaning container having a treating space having a cross-sectional area perpendicular to a direction of a laminar flow of a fluid crossing on said object that is predetermined times as large as the maximum value of the cross-sectional area of an object to be treated perpendicular to said direction, and the cleaning fluid is returned to the fluid storage tank to circulate the cleaning fluid without being exposed to outside air. In this method, the cleaning fluid may comprise a resist removing liquid for removing a resist mask, which is patterned on the surface of the object, and the object, and a side-wall protection side-wall protection layer removing liquids for removing a side-wall protection layer adhering to a side wall of an etched layer when dry-etching the object using the resist mask as a mask, and the resist removing liquid may be supplied to treat the object after the side-wall protection layer removing liquid is supplied to treat the object.

According to this method, it is possible to rapidly and simply remove both of the side-wall protection layer and the resist mask, which adhere to the surface of the wafer, by continuous wet cleaning treatments. In addition, by carrying out the cleaning treatment in this order, it is possible to avoid the hardening of the side-wall protection layer, which can occur when the treatments are carried out in the opposite order, and unexpected accidents, such as the covering of the side-wall protection layer with the hardening layer which can be formed on the surface of the resist mask.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a cleaning device, cleaning system and cleaning method according to the present invention will be described in detail below.

Figure 1:
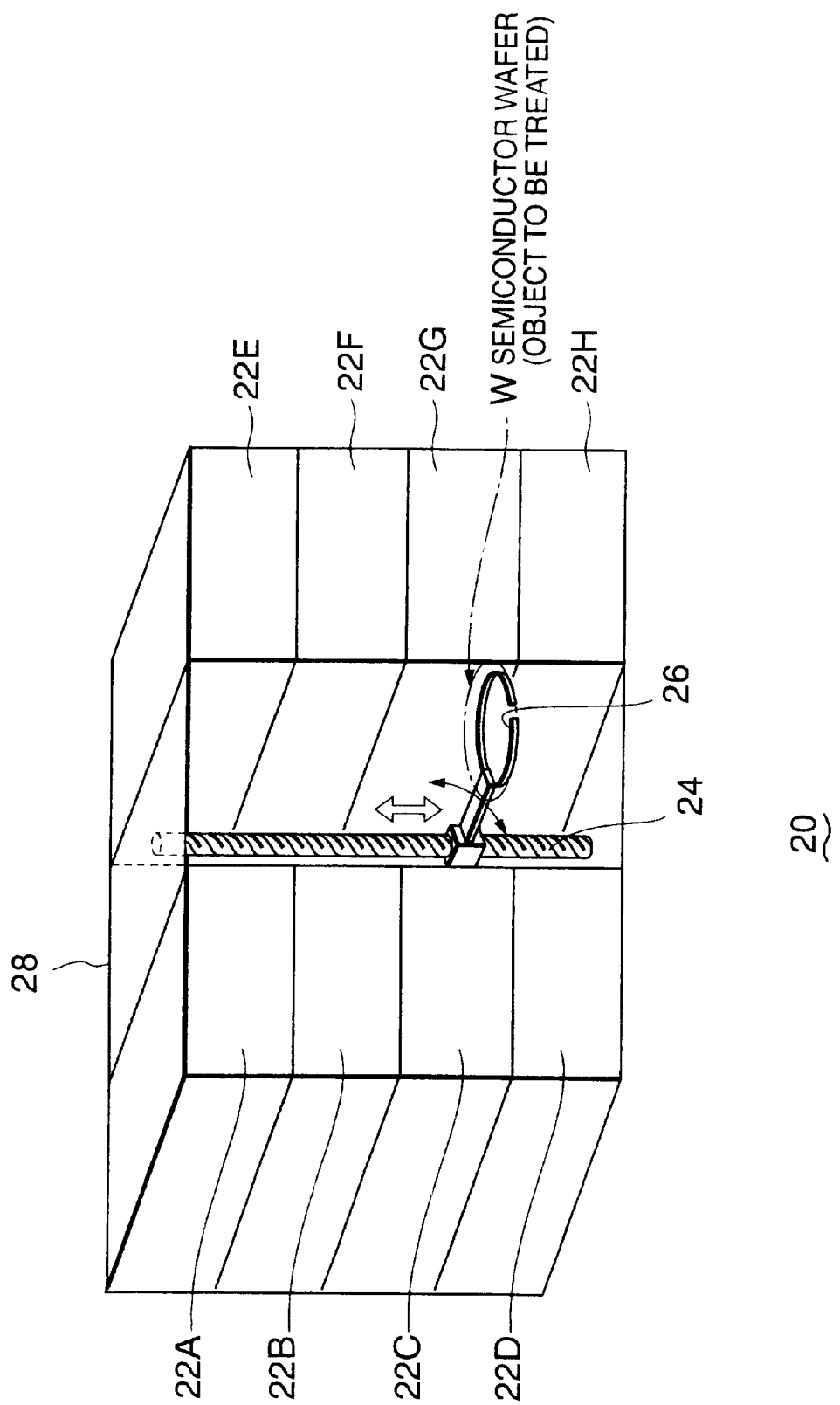
FIG. 1 is a schematic diagram showing the appearance of a cleaning system according to the present invention.
Figure 2:
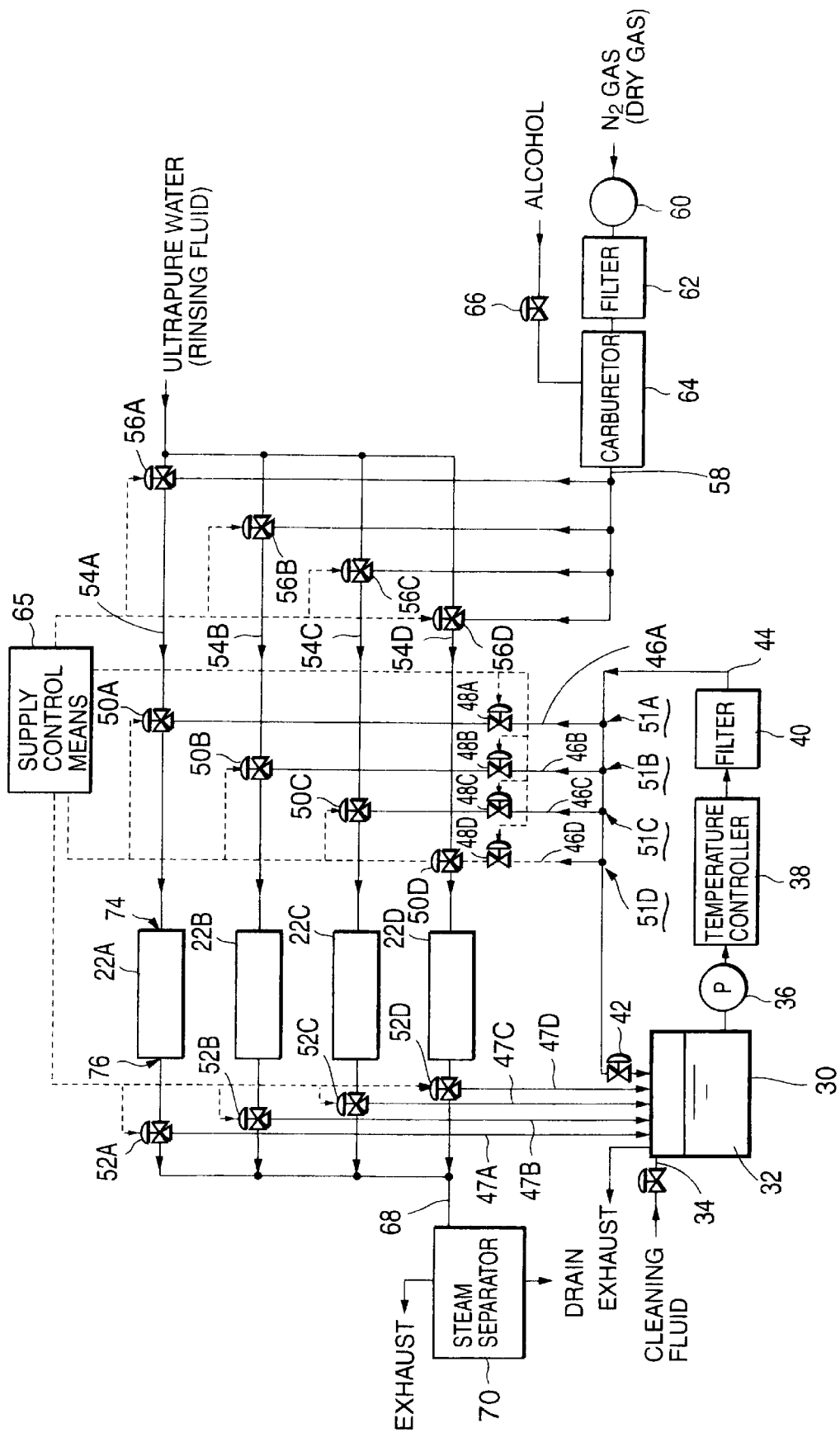
FIG. 2 is a block diagram of a part of the cleaning system shown in FIG. 1.
Figure 3:
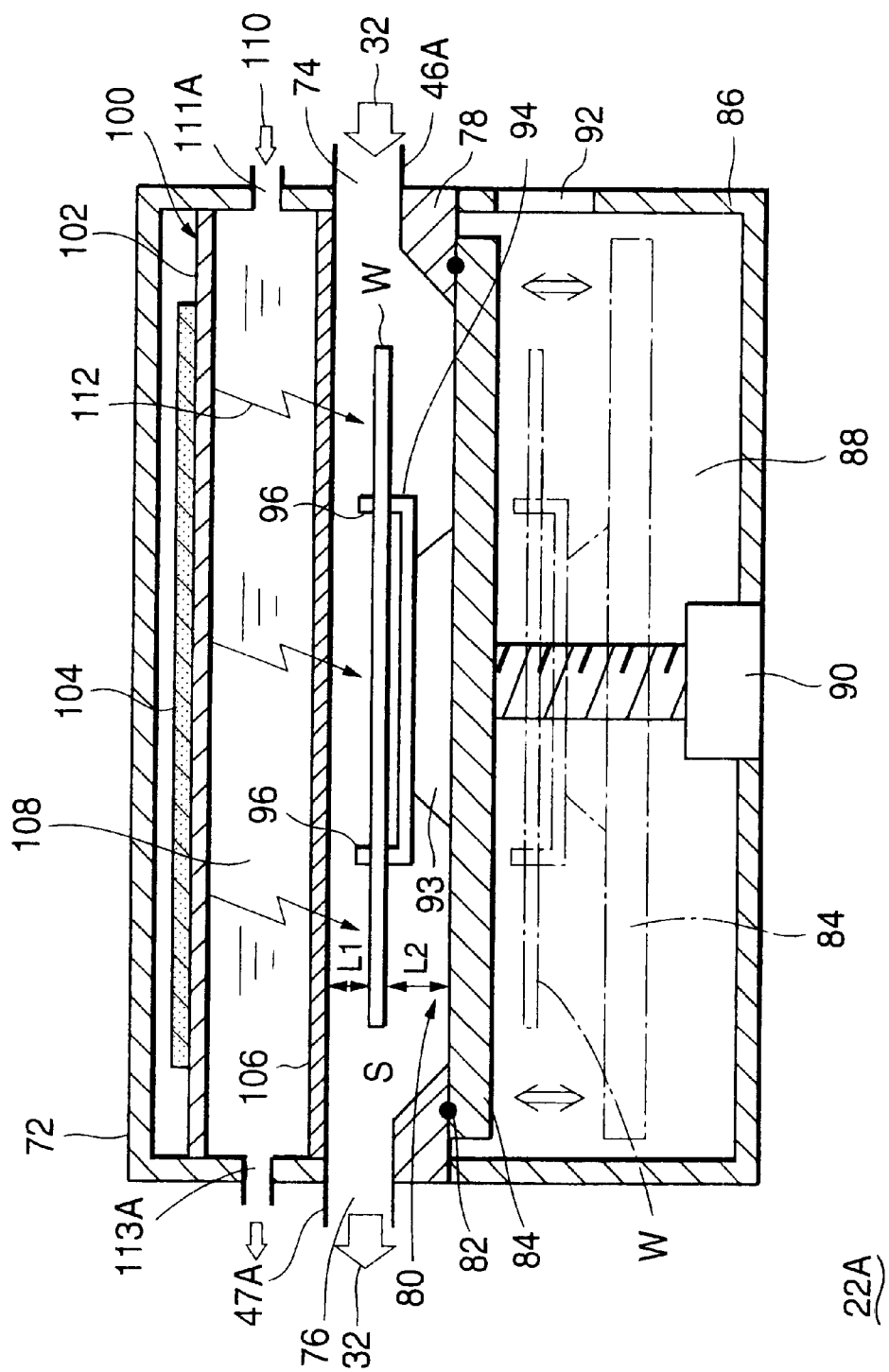
FIG. 3 is a sectional view of an example of a cleaning device for use in the cleaning system shown in FIG. 1.
Figure 4:
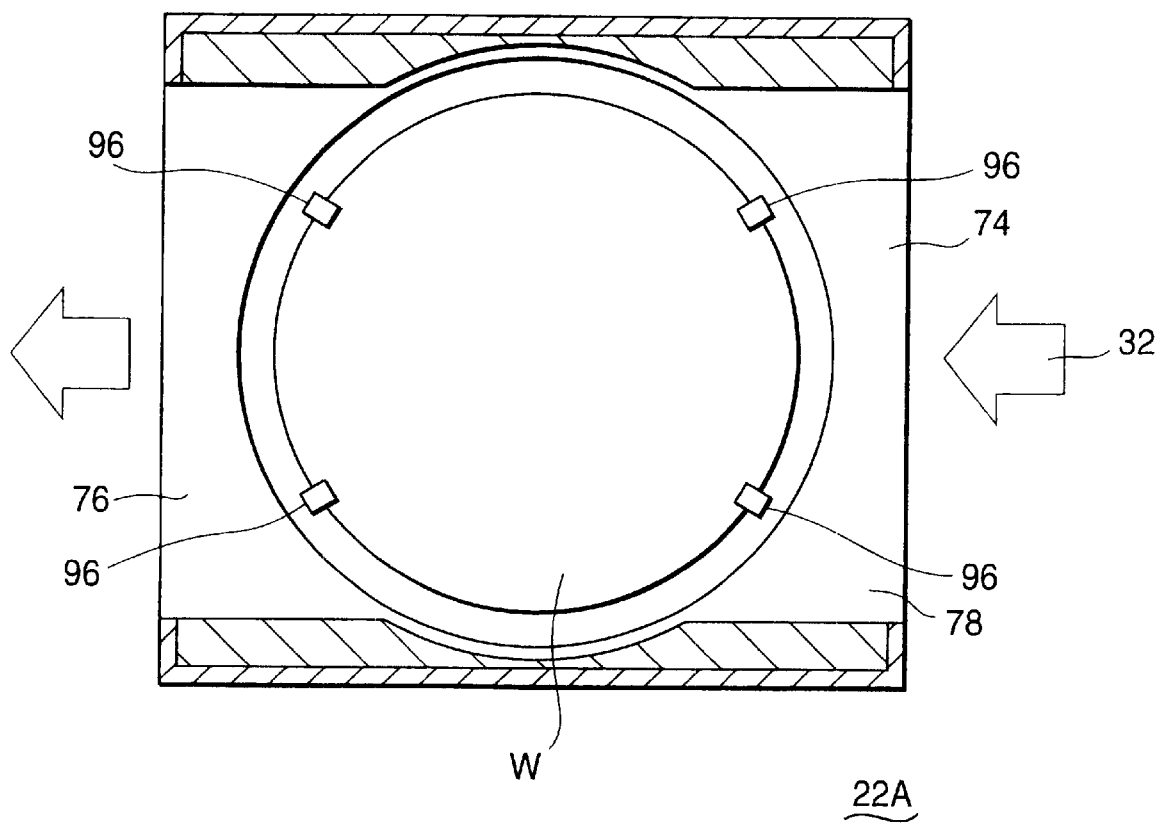
FIG. 4 is a plan view of the cleaning device shown in FIG. 3.

FIG. 1 is a schematic diagram showing the appearance of a cleaning system according to the present invention, and FIG. 2 is a block diagram of a part of the cleaning system shown in FIG. 1. FIG. 3 is a sectional view of an example of a cleaning device for use in the cleaning system shown in FIG. 1, and FIG. 4 is a plan view of the cleaning device as shown in FIG. 3.

As shown in these figures, a cleaning system 20 has a plurality of substantially rectangular-parallelopipedic cleaning devices 22A through 22H, e.g., two columns of cleaning devices stacked in four stages in the shown example, i.e., eight cleaning devices 22A through 22H as a whole. Then, between the two columns of cleaning devices, there is provided a lifting mechanism 24 which comprises, e.g., a ball screw, and which is movable vertically. A transfer arm 26 capable of bending, stretching and turning for holding and transferring a semiconductor wafer W serving as an object to be treated is mounted to the lifting mechanism 24 to allow the wafer W to be introduced into and discharged from each of the cleaning devices 22A and 22H.

Of course, two or more columns of cleaning devices may be provided around the lifting mechanism. Thus, the space occupied by the system is greatly reduced. Furthermore, the cleaning devices 22 should not be limited to than in the shown embodiment, but a plurality of cleaning devices may be arranged in parallel in optional horizontal directions, not only in vertical directions, to improve the foot print.

The whole cleaning system 20 is covered with a casing 28 which is filled with an inert gas, e.g., $N_2$ gas. Furthermore, the I/O port for introducing/discharging the wafer W into/from the cleaning system is not shown.

For the cleaning devices 22A through 22H, the same cleaning fluid may be used, or different kinds of cleaning fluids may be used. Moreover, a plurality of kinds of cleaning fluids may be used for one cleaning device. In this case, the components of the respective cleaning devices 22A through 22H are formed of a material having a high corrosion resistance to the used cleaning fluid.

FIG. 2 is a block diagram of a part of the above described cleaning system. This figure shows that the same cleaning fluid is supplied to four cleaning devices 22A through 22D. Furthermore, the other cleaning devices 22E through 22H have the same construction as those of the cleaning devices 22A through 22D, or different kinds of cleaning fluids may be supplied thereto.

In FIG. 2, a fluid storage tank 30 is closed, and stores therein a cleaning fluid 32 in an inert atmosphere of $N_2$ or the like. If the cleaning fluid 32 is in short supply, it is supplied to the fluid supply tank 30 via a supply system 34. To the fluid storage tank 30, a stand-by circulating system 44 is connected for returning the fluid to the fluid storage tank 30. The stand-by circulating system 44 comprises a circulating pump 36, a temperature controller 38 for controlling the temperature of the cleaning fluid 32, a filter 40 for removing impurities in the cleaning fluid 32, and a shut-off valve 42. During standby, the stand-by circulating system 44 circulates the cleaning fluid 32 to maintain the cleaning fluid 32 at a constant temperature by means of the temperature controller 38 while removing, e.g., granular impurities, in the cleaning fluid 32 by means of the filter 40.

In addition, supply lines 46A, 46B, 46C and 46D are provided for connecting the stand-by circulating system 44 to the cleaning devices 22A through 22D, respectively, to supply the cleaning fluid 32 to the respective cleaning devices 22A through 22D. The respective supply lines 46A through 46D are sequentially connected to flow regulating valves 48A through 48D and entrance-side three-way valves 50A through 50D. Moreover, the respective cleaning devices 22A through 22D are connected to the fluid storage tank 30 to provide reflux lines 47A, 47B, 47C and 47D for returning the cleaning fluid 32 to the fluid storage tank 30. In addition, exit-side three-way valves 52A through 52D are provided in the reflux lines 47A through 47D, respectively. Since the cleaning devices 22A through 22D are closed to be separated from outside air as will be described later, there are formed cleaning-fluid circulating lines 51A, 51B, 51C and 51D for circulating the cleaning fluid 32 between the fluid storage tank 30 and the cleaning devices 22A through 22D by means of the supply lines 46A through 46D and the reflux lines 47A through 47D without exposing the cleaning fluid 32 to outside air. Of course, the supply lines 46A through 46D may be connected directly to the fluid storage tank 30 and the cleaning devices 22A through 22D, not via the stand-by circulating system 44.

On the other hand, the entrance-side three-way valves 50A through 50D are connected to rinsing fluid supply systems 54A through 54D for supplying a rinsing fluid, e.g., ultrapure water, without exposing the rinsing fluid to outside air, respectively, and rinsing three-way valves 56A through 56D are provided in the rinsing fluid supply systems 54A through 54D, respectively. The rinsing three-way valves 56A through 56D are commonly connected to a dry fluid supply system 58 for supplying a dry fluid, such as $N_2$ gas or an alcohol vapor, without exposing the dry fluid to outside air. In the dry fluid supply system 58, a regulator 60 for regulating the flow rate of the fluid, a filter 62 for removing impurities in the fluid, and a carburetor 64 for vaporizing alcohol which is selectively supplied by means of a shut-off valve 66, are provided sequentially from the upstream side. In addition, a supply control means 65 is provided for selectively controlling the continuous supply of these treating fluid, rinsing fluid and drying fluid, and recovering fluid and discharging fluid, which will be described later.

The exit-side three-way valves 52A through 52D are connected to a discharging system 68 for discharging useless liquid and gas. In the discharging system 68, a steam separator 70 is provided for separating gas from liquid to discharge liquid as drain to the outside of the system.

Referring to FIGS. 3, 4, 12 and 13, the cleaning device will be described below. Since the basic structures of the cleaning devices 22A through 22H are the same, the cleaning device 22A will be described as an example. The cleaning device 22A has a box-shaped cleaning container 72 of, e.g., stainless. A fluid inlet 74 is formed in one side wall of the cleaning container 72, and a fluid outlet 76 is formed in the opposite side wall thereto. The above described supply line 46A and reflux line 47A are respectively connected to the fluid inlet 74 and the fluid outlet 76 for allowing the flow of the cleaning fluid 32 (see FIG. 2).

In the bottom portion 78 of the cleaning container 72, there is formed an opening 80 which allows passing of the semiconductor wafer W serving as an object to be treated. The opening 80 is fluid-tightly closed by a closing lid 84 via a seal member 82, such as an O-ring. Thus, the respective fluids, the semiconductor wafer W and so forth in the cleaning container 72 are not exposed to outside air during treatment. Below the closing lid 84, a transfer chamber 88 defined by a partition wall 86 of, e.g., stainless, is provided. The closing lid 84 is supported on the bottom of the partition wall 86 via a lifting mechanism 90, so that the whole closing lid 84 can vertically move by a stroke required to introduce/discharge the wafer as shown by the chain line in FIG. 3.

In the side wall of the partition wall 86, a transfer port 92 for introducing/discharging the wafer W is provided, so that the transfer arm 26 shown in FIG. 1 enter the transfer port 92 to deliver the wafer W. On the top face of the closing lid 84, a wafer damper 94 serving as a holding means is provided via a base 93. The wafer damper 94 has three or more pawl portions, i.e., four pawl portions 96 in the shown embodiment, by which the peripheral portion of the wafer W can be detachably held.

On the other hand, in the ceiling portion of the cleaning container 72, a sound wave radiating unit 100 is provided as a turbulent flow forming means for generating a turbulent flow in the passing cleaning flow 32 or for promoting the turbulent flow. Specifically, the sound wave radiating unit 100 has a plate ultrasonic element 104 bonded to an element substrate 102 of, e.g., stainless, by means of an adhesive or the like. The ultrasonic element 104 has a size which is set so as to cover the front face or a part of the flat faces of the wafer W, so that the surface of the wafer can be irradiated with ultrasonic waves of, e.g., about 850 kHz. In addition, a closed buffer tank 108 for efficiently propagating the generated ultrasonic waves to the surface of the wafer is provided between a partition board 106 of, e.g., stainless, which defines a treating space S from the fluid inlet 74 to the fluid outlet 76, and the element substrate 102. One end of the buffer tank 108 is provided with a buffer water inlet 111A for introducing buffer water 110, and the other end of the buffer tank 108 is provided a buffer wafer outlet 113A. By passing buffer water 110 through the buffer tank 108, it is expected that it is possible to control the temperature of the treating fluid 32 and the object W, and it is possible to remove bubbles generated in the buffer tank 108. In addition, the buffer water outlet 113A preferably has an opening at a position so that bubbles are not collected between the opening and the element substrate 102. Moreover, at least a part of the opening preferably contacts the element substrate 102, and the buffer tank 108 is preferably inclined by, e.g., about 5 degrees, so that the buffer water outlet 113A is arranged on the upper side.

As shown in FIG. 4, the widths of the fluid inlet 74 and the fluid outlet 76 are set to be equal to or greater than the diameter of the wafer W so as to allow the cleaning fluid to uniformly flow to the surface of the wafer. Moreover, both of the distance L1 between the wafer W and the partition board 106, and the distance L2 between the wafer W and the closing lid 84 are set to be as small as possible, e.g., in the range of from about 0.35 mm to about 10 mm. The volume of the treating space S and the flow passage area (the cross-sectional area perpendicular to a direction of a laminar flow of a fluid crossing on an object to be treated) are set to be very small. For example, the volume of the treating space S, is set to be in the range of from about 30 cm$^3$ to about 6000 cm$^3$, with respect to a volume of about 22 cm$^3$ of a 200 mm wafer, i.e., about 1.5 times to about 300 times as large as the volume of the object to be treated, and the flow passage area is set to be in the range of from about 2.1 cm$^2$ to about 420 cm$^2$, i.e., about 1.5 times to about 300 times as large as the cross-sectional area of the wafer at the central portion thereof, which is the maximum value of the cross-sectional area in a direction perpendicular to the above described direction of the object to be treated. By setting the volume of the treating space S as described above, the used quantities of the cleaning fluid 32 and the rinsing fluid are smaller than those in the conventional cleaning devices. In addition, the flow velocity of the cleaning fluid 32 flowing through the treating space S can be set to be, e.g., about 50 cm/sec, which is far greater than the flow velocity in the conventional cleaning device, e.g., about 0.5 cm/sec, so that the cleaning fluid can be supplied to the wafer at a high velocity. In addition, the length of the treating space S is about 230 to 250 mm when the wafer W has a size of 8 inches (200 mm). In addition, the thickness of the element substrate 102 and the partition board 106 is a thickness integer times as large as the half-wave length of ultrasonic waves, so that the ultrasonic waves can be efficiently propagated.

Figure 12:
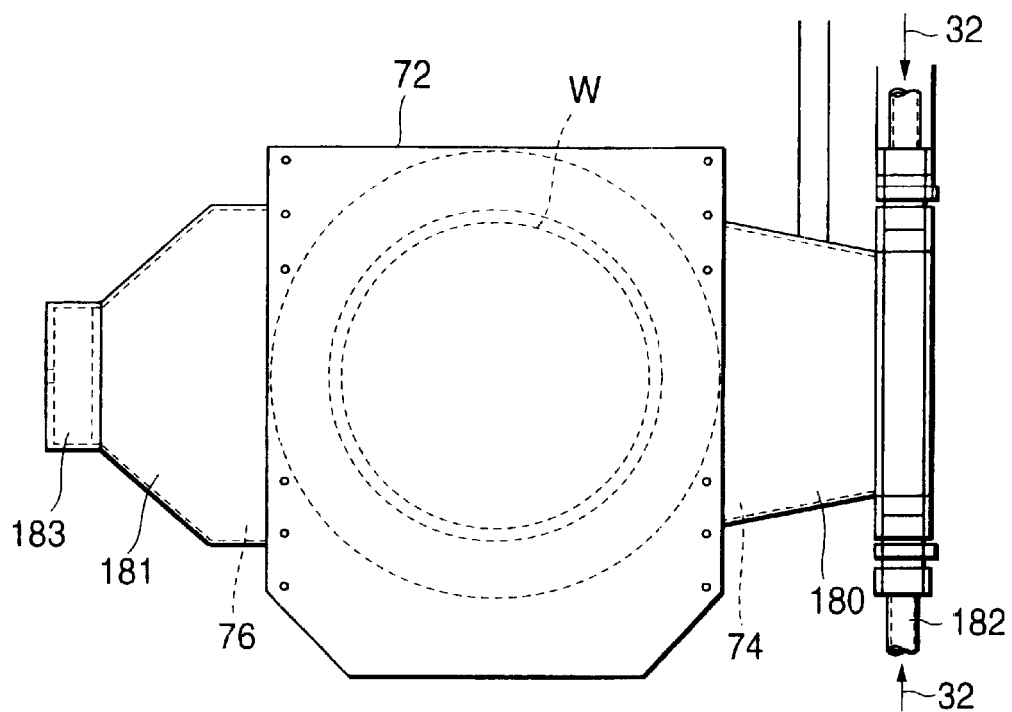
FIG. 12 is a plan view showing a cleaning fluid introducing part, which is provided in a fluid inlet of a cleaning container, and a cleaning fluid discharging part which is provided in a fluid outlet of the cleaning container.
Figure 13:
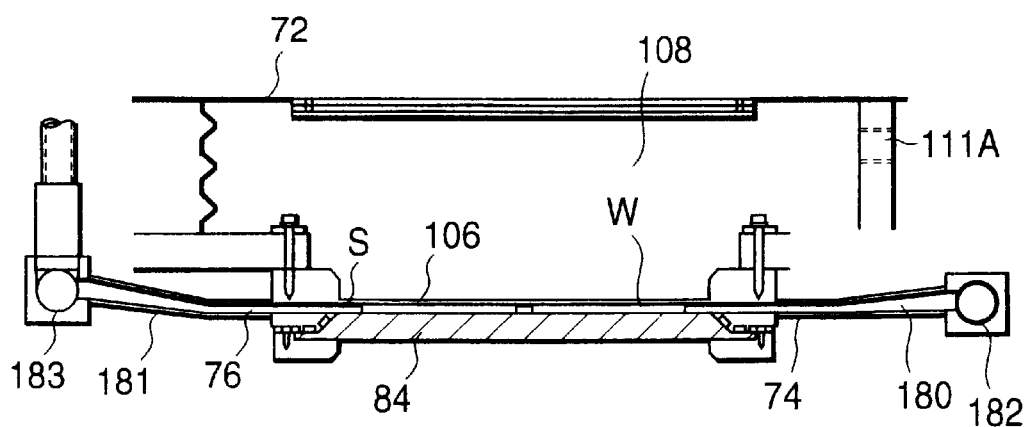
FIG. 13 is a sectional view showing a cleaning fluid introducing part, which is provided in a fluid inlet of a cleaning container, and a cleaning fluid discharging part which is provided in a fluid outlet of the cleaning container.

As shown in FIGS. 12 and 13, the fluid inlet 74 of the cleaning container 74 is provided with a divergent flat cleaning-fluid introducing part 180 between the fluid inlet 74 and an input pipe 182 which is provided for introducing the cleaning fluid 32. In addition, the fluid outlet 76 of the cleaning container 72 is provided with a convergent flat cleaning-fluid discharging part 181 between the fluid outlet 76 and a discharging pipe 183 which is provided for discharging the cleaning fluid 32. The cleaning-fluid introducing part 180 is formed so that the thickness of the flow passage decreases from the input pipe 182 toward the fluid inlet 74. The cleaning-fluid introducing part 180 has a length of about 70 mm, and a thickness of about 10 mm in the vicinity of the input pipe 182 and a thickness of about 5 mm in the vicinity of the fluid inlet 74. In addition, the cleaning-fluid introducing part 180 is formed so that the width of the flow passage increases from the input pipe 182 toward the fluid inlet 74, and has a width of about 150 mm in the vicinity of the input pipe 182 and a width of about 220 mm in the vicinity of the fluid inlet 74. The cleaning-fluid discharging part 181 is formed so that the thickness of the flow passage increases from the fluid outlet 76 toward the discharging pipe 183. The cleaning-fluid discharging part 181 has a length of about 70 mm, and a thickness of about 5 mm in the vicinity of the fluid outlet 76 and a thickness of about 10 mm in the vicinity of the discharging pipe 183. In addition, the cleaning-fluid discharging part 181 is formed so that the width of the flow passage decreases from the fluid outlet 76 toward the discharging pipe 183, and has a width of about 220 mm in the vicinity of the fluid outlet 76 and a width of about 100 mm in the vicinity of the discharging pipe 183. When the cleaning fluid 32 flowed through the input pipe 182 at 20 lit/min, the flow velocity of the cleaning fluid 32 in the input pipe 182 was about 22 cm/sec, whereas the flow velocity in the treating space S was about 30 cm/sec. By providing the cleaning fluid introducing part 180 and the cleaning fluid discharging part 181, it is possible to cause the cleaning fluid 32 to flow through the treating space S as a laminar flow while holding a high flow velocity to some extent.

Figure 5:
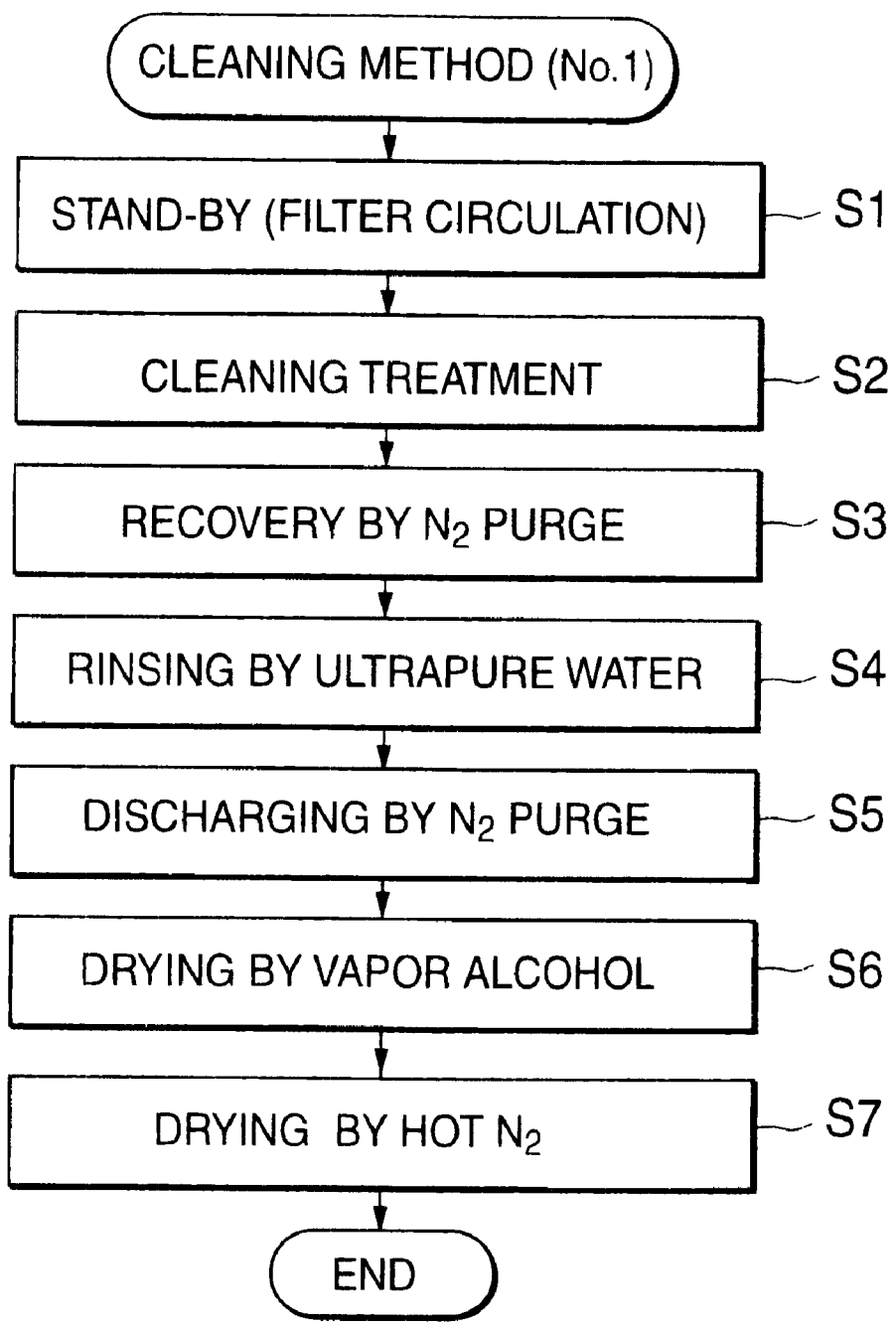
FIG. 5 is a flow chart showing a cleaning method according to the present invention.

Referring to the flow chart of FIG. 5, the operation of this preferred embodiment with the above described construction will be described below.

First, the transfer arm 26 shown in FIG. 1 is moved vertically, expanded and contracted for introducing an untreated semiconductor wafer W into a desired one of the cleaning devices 22A through 22H. When the wafer W is introduced, the closing lid 84, on which the wafer damper 94 is mounted as shown in FIG. 3, is moved downwards, and in this state, the transfer arm 26 is stretched to deliver the wafer W to the wafer damper 94 to allow the peripheral portion of the wafer W to be held by the pawl portions 96. Then, when the wafer W is held, the lifting mechanism 90 is driven to move the closing lid 84 upwards to liquid-tightly close the opening 80 of the bottom portion 78 of the cleaning container 72 so that the treating space S is in the closed state.

Then, the cleaning fluid 32 having a high flow velocity is allowed to flow through the treating space S from the fluid inlet 74 toward the fluid outlet 76 and the cleaning-fluid discharging part 181 via the cleaning-fluid introducing part 180 to clean both of top and bottom faces of the wafer W. In this case, since the cleaning fluid 32 flows through the very narrow treating space S at the high flow velocity, the cleaning can be efficiently and rapidly carried out. In addition, the presence of the fluid inlet 74 and the cleaning-fluid discharging part 181 allows the cleaning fluid 32 to efficiently flow through the treating space S as a laminar flow at the high flow velocity. At this time, since the flow velocity of the cleaning fluid 32 is sufficiently high as described above, a turbulent flow is produced at a portion of the cleaning fluid 32 in the laminar flow state, which contacts the surface of the wafer, so that the flow velocity of the cleaning fluid 32 contacting the surface of the wafer is locally increased. Thus, the cleaning fluid 32, such as a flesh chemical, always acts on the surface of the wafer, so that the cleaning can be efficiently carried out. In addition, the treating space S serves as a fluid guiding means, and the cleaning fluid flows in parallel to the flat surface of the wafer, so that the wafer is uniformly treated.

In this case, the treating fluid must be caused to flow in a high velocity in order to form a turbulent flow in the cleaning fluid contacting the surface of the wafer. Such a high velocity flow can be easily produced by decreasing the flow passage area of the treating space S with respect to the feed rate of the circulating pump (see FIG. 2). In addition, by driving the ultrasonic element 104 of the ultrasonic wave radiating unit 100 simultaneously with the above described cleaning treatment, radiated ultrasonic waves 112 are propagated through the buffer water 110 in the buffer tank 108, so that the whole surface of the wafer W is irradiated with the ultrasonic waves 112. Thus, vibrations perpendicular to the flow direction are applied to the cleaning fluid 32 to produce a turbulent flow in the cleaning fluid 32 contacting the surface of the wafer or to promote the produced turbulent flow. Therefore, the promoted turbulent flow reduces the influence of an immobile layer produced on the surface of the object due to the viscosity of the chemical, so that it is possible to rapidly and efficiently carry out the cleaning treatment. Furthermore, waves for use therein should not be limited to ultrasonic waves, but usual sound waves of an audio frequency band may be used.

Although heat is generated by driving the ultrasonic element 104, the buffer water 110 flowing through the buffer tank 108 also serves as cooling water, so that it is possible to inhibit the ultrasonic element 104 from being peeled off by the deterioration of the adhesive, by which the ultrasonic element 104 is bonded to the element substrate 102. In addition, although bubbles are produced in the buffer water 110 by the action of the ultrasonic waves 112, the buffer water 110 is circulated, so that the produced bubbles are also transferred from the buffer tank 108 to the outside so as not to be collected in the buffer tank 108. Moreover, when the cleaning fluid corrodes the partition board 106, it has only to exchange the partition board 106, and it is possible to prevent the element substrate 102 from being corroded.

The cleaning device according to the present invention can produce the high velocity flow which forms the turbulent flow as described above. On the other hand, the cleaning device according to the present invention can also produce a low velocity flow so as to carry out the wet etching of only the surface of the object to be treated, by controlling the feed rate of the treating fluid to be a low rate. The flow velocity of the cleaning device according to the present invention can be set to be in the range of, e.g., from about 2.5 to about 5000 cm/sec.

After the cleaning treatment is thus completed, the supply of the cleaning fluid 32 is stopped. Then, $N_2$ gas or the like serving as a recovering fluid is allowed to flow to force the cleaning fluid 32, which is collected in the treating space S and pipes, to recover the cleaning fluid 32 in the fluid storage tank 30. By this recovery, the consumed quantity of the cleaning fluid 32 can be reduced. The recovery of the cleaning fluid may be carried out by using a dry fluid, such as $N_2$ gas, which is supplied from the dry fluid supply system 58, as a recovering fluid, or by providing an additional recovering fluid supply system. Then, a rinsing fluid, such as ultrapure water, is allowed to flow through the treating space S to wash away and rinse the cleaning fluid which adheres to the surface of the wafer. Also when the rinsing fluid is supplied, the ultrasonic element 104 is preferably driven to irradiate the surface of the wafer with the ultrasonic waves 112 to produce a turbulent flow, so that it is possible to rapidly carry out the rinsing treatment.

Moreover, $N_2$ gas or the like serving as a discharging fluid is allowed to flow through the treating space S to discharge the rinsing fluid. By discharging the rinsing fluid, it is possible to more efficiently carry out the drying of the rinsing fluid which will be subsequently carried out. The discharging fluid may be the dry fluid or the recovering fluid, or may be supplied by providing an additional discharging fluid supply system.

Then, a vapor alcohol, such as isopropyl alcohol (IPA), is allowed to flow to break the surface tension of the rinsing fluid, and hot $N_2$ gas or the like is allowed to flow to completely dry the surface of the wafer and the interior of the cleaning container 72. Furthermore, the above described treatments using the recovering fluid and discharging fluid are carried out for more efficiently carrying out the cleaning treatment, so that the user can optionally select whether the treatments be carried out.

Furthermore, the above described drying technique may be the Marangoni drying, the drying using the flow of IPA vapor, or the drying under reduced pressure. The Marangoni drying is designed to supply IPA vapor into a chamber using $N_2$ gas as a carrier gas to discharge wafer in the chamber at a very slow rate to dry the surface of the wafer after the liquid level drop due to the difference between water and IPA. Thereafter, in order to complete the drying, hot $N_2$ gas is allowed to flow, or the surface of the wafer is irradiated with infrared rays. The drying using the flow of IPA vapor is designed to supply IPA vapor into the chamber using N2 gas as a carrier gas after rapidly discharging water in the chamber, and to stop the supply of IPA vapor when water in the chamber is replaced with IPA vapor, and to spray hot $N_2$gas of a high temperature. In this case, infrared rays may be used as heat sources. In addition, the drying under reduced pressure is effective when the chamber is slightly greater than the wafer. Thus, it is possible to shorten the time required for carrying out pressure reduction, so that it is possible to evaporate wafer before the production of water mark is started. In this case, it is possible to carry out pressure reduction in a short time by heating by the irradiation with infrared rays. According to the present invention, the drying can realize a more excellent drying state by combining the Marangoni drying with the drying under reduced pressure or by combining the drying using the flow of IPA vapor with the drying under reduced pressure.

After these operations are completed, the closing lid 84 is moved downwards, and the cleaned wafer W is picked up by means of the transfer arm 26 (see FIG. 1). Furthermore, the cleaning fluid 32 may be selected from various fluids in accordance with the material to be cleaned. The cleaning fluid 32 is not only a liquid, but it may be also a mist containing gas or ozone containing gas which will be described later. In addition, the above described cleaning can be independently carried out in each of the cleaning devices 22A through 22H.

Referring to the flow charts of FIGS. 2 and 5, the above described flow using four cleaning devices 22A through 22D will be described below.

First, during standby, in which no cleaning is carried out, the cleaning-fluid circulating systems 46A through 46D are closed, the stand-by circulating system 44 is driven to circulate the cleaning fluid 32 in the fluid storage tank 30 into this system. In addition, the cleaning fluid is maintained at a predetermined temperature by means of the temperature controller 38 to be chemically stabilized, and impurities in the cleaning fluid 32 are removed by the filter 40 (S1). Then, when the cleaning is carried out, the respective three-way valves 50A through 50D and 52A through 52D of the cleaning-fluid circulating systems 46A through 46D of the corresponding cleaning devices 22A through 22D are open so that the cleaning fluid flows therethrough. Thus, the cleaning of the semiconductor wafer W is carried out in a desired cleaning device as described above (S2).

In this case, the cleaning fluid 32 is supplied to a required cleaning device at a pressure of the circulating pump 36. Furthermore, the supply pressure of the circulating pump 36 may be sufficiently high, or may be enhanced by closing the shut-off valve 42 of the stand-by circulating system 44 if necessary. Thus, during the cleaning, the cleaning fluid 32 passing through the cleaning device returns to the fluid storage tank 30 to be used in circulation, so that the cleaning fluid 32 is not useless.

After the cleaning is thus completed, the entrance-side three-way valves 50A through 50D are switched to the gas circulation side. Simultaneously, the respective rinsing three-way valves 56A through 56D are switched to the gas supply side, and the dry gas supply system 58 is driven to supply $N_2$ gas as a collecting fluid to carry out recovery (S3). At this time, alcohol is not supplied. By this $N_2$ gas purge, the cleaning fluid 32 collected in the cleaning-fluid circulating line and cleaning devices 22A through 22D to be cleaned is pushed by $N_2$ gas to be returned to the fluid storage tank 30 to be recovered. Thus, the cleaning fluid 32 is recovered to be effectively utilized without being wasted.

Then, the supply of $N_2$ gas is stopped, and the rinsing three-way valves 56A through 56D are switched to the rinsing circulation side. Simultaneously, the exit-side three-way valves 52A through 52D are switched to the discharging side to supply a rinsing fluid of, e.g., ultrapure water, to the corresponding cleaning devices 22A through 22D to wash away the cleaning fluid which adheres to the surface of the wafer or the like (S4). This rinsing fluid used for washing the cleaning fluid flows through the discharging system 68 to flow in the steam separator 70, in which liquid is separated from gas to be discharged to the outside of the system.

Then, the supply of the rinsing fluid is stopped, and the rinsing three-way valves 56A through 56D are switched to the $N_2$ gas passing side to supply $N_2$ gas (containing no alcohol) as a discharging fluid to discharge the rinsing fluid, which have been collected in the cleaning devices 22A through 22D, to the steam separator 70 by $N_2$ gas (S5).

Then, while $N_2$ gas is supplied as described above, the shut-off valve 66 is open to vaporize an alcohol, e.g., isopropyl alcohol, in the carburetor 64 to mix the vaporized alcohol in $N_2$ gas (S6). Thus, the vaporized alcohol is supplied into the cleaning devices 22A through 22D to break the surface tension of the rinsing fluid adhering to the interior thereof, so that it is difficult to form droplets and it is easy to dry the cleaning devices.

Then, the supply of the vaporized alcohol is stopped, and only $N_2$ gas is allowed to remain flowing to dry the surface of the wafer and the interior of the cleaning devices 22A through 22D (S7). In this case, $N_2$ gas is heated to be allow to flow as hot $N_2$ gas, so that it is possible to reduce the time required for carrying out the drying. After the above described series of drying steps (S6 and S7) are carried out, the cleaning of the wafer W is completed, and the wafer W is taken out of the leaning devices 22A through 22D to be transported.

Thus, the cleaning fluid 32 is not wasted by circulating and using the cleaning fluid 32 in the full closed state. In addition, the cleaning fluid 32 is circulated without being exposed to outside air, so that the volatile constituents in the cleaning fluid 32 are not vaporized. Therefore, the property of the cleaning fluid 32 can be stably maintained. In addition, the problem of the metal wiring layer, particularly the problem of oxidation of copper which is easily oxidized, can be easily avoided by controlling only the reduction of the dissolved oxygen in the cleaning fluid 31 and rinsing fluid.

Furthermore, the cleaning treatment carried out herein can be used as one of every kinds of cleaning treatments, e.g., the cleaning treatment after ashing, the usual pre-cleaning treatment carried out before films are applied on wafers, or the cleaning for removing resists. The cleaning fluids for use in the pre-cleaning may include a mixture of ammonia ($NH_3$) and hydrogen peroxide ($H_2O_2$), or a mixture of hydrogen chloride (HCl) and hydrogen peroxide. The cleaning fluids for use in the resist removal may include a mixture of concentrated sulfuric acid and hydrogen peroxide. Other cleaning fluids may include dilute hydrofluoric acid (HF, $H_2O$), buffered hydrofluoric acid (HF, $NH_4F$, $H_2O$), sulfuric acid hyperhydration ($H_2SO_4$, $H_2O_3$, $H_2O$), and supercritical fluid, such as $CO_2$.

When a usual neutral chemical is used as the cleaning fluid, the element substrate 102 and partition board 106 in the cleaning device may be made of stainless. When a cleaning fluid corroding stainless, e.g., an acid cleaning fluid, is used, the partition board 106 is made of, e.g., Teflon, which has a high corrosion resistance. In addition, the element substrate 102 may be made of quartz transmitting ultrasonic waves.

Moreover, the cleaning fluids should not be limited to the above described liquids, and may include gaseous cleaning fluids wherein the mist of ultrapure water is mixed in the atmosphere of ozone to accelerate an ozone reaction, and gaseous cleaning fluid wherein sulfuric acid mist is mixed in the atmosphere of ozone to accelerate an ozone reaction.

Figure 6:
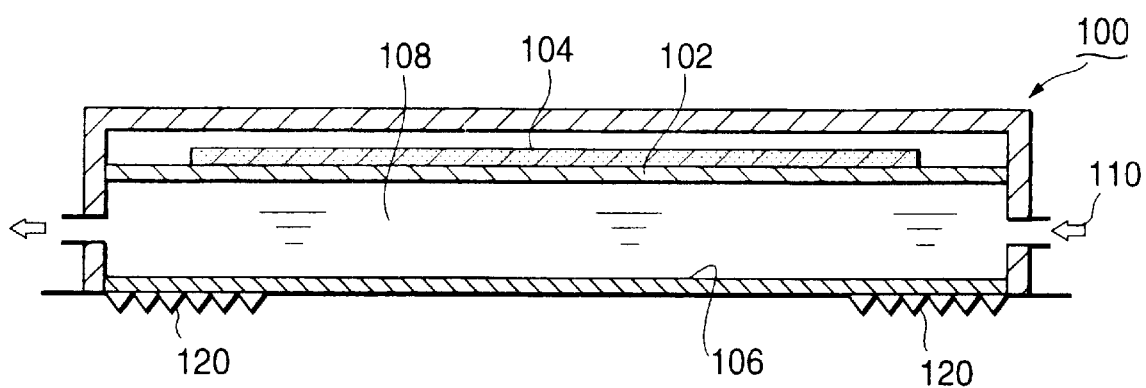
FIG. 6 is a sectional view of a modified example of a turbulent flow forming means.
Figure 7:
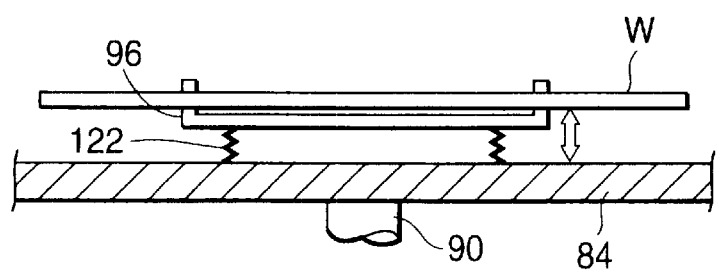
FIG. 7 is a sectional view of a modified example of a mounting mechanism of a holding means.

In addition, while the sound wave radiating unit 100 has been provided as the turbulent flow forming means, a fine wave-shaped irregularities 120 having a height of about 0.1 to 5 mm, in place of or together with the sound wave radiating unit 100, may be provided on the surface of the partition board 106, which defines the treating space S, as shown in FIG. 6, to produce a turbulent flow in the cleaning fluid. Moreover, while the space, in which the fixed base 93 can be provided for delivering the wafer W from the transfer arm 26 to the wafer clamper 94 when the wafer damper 94 is mounted on the closing lid 84, has been provided between the closing lid 84 and the wafer clamper 94, a bellow 122 for allowing the wafer clamper 94 to move vertically while holding the fluid tightness may be provided in place of the space as shown in FIG. 7. According to this, if the bellow 122 is expanded only when delivering the wafer W and if the bellow is contracted during the cleaning, it is possible to decrease the height of the treating space S to further decrease the flow passage area, so that it is possible to enhance the flow velocity of the cleaning fluid.

Figure 8:
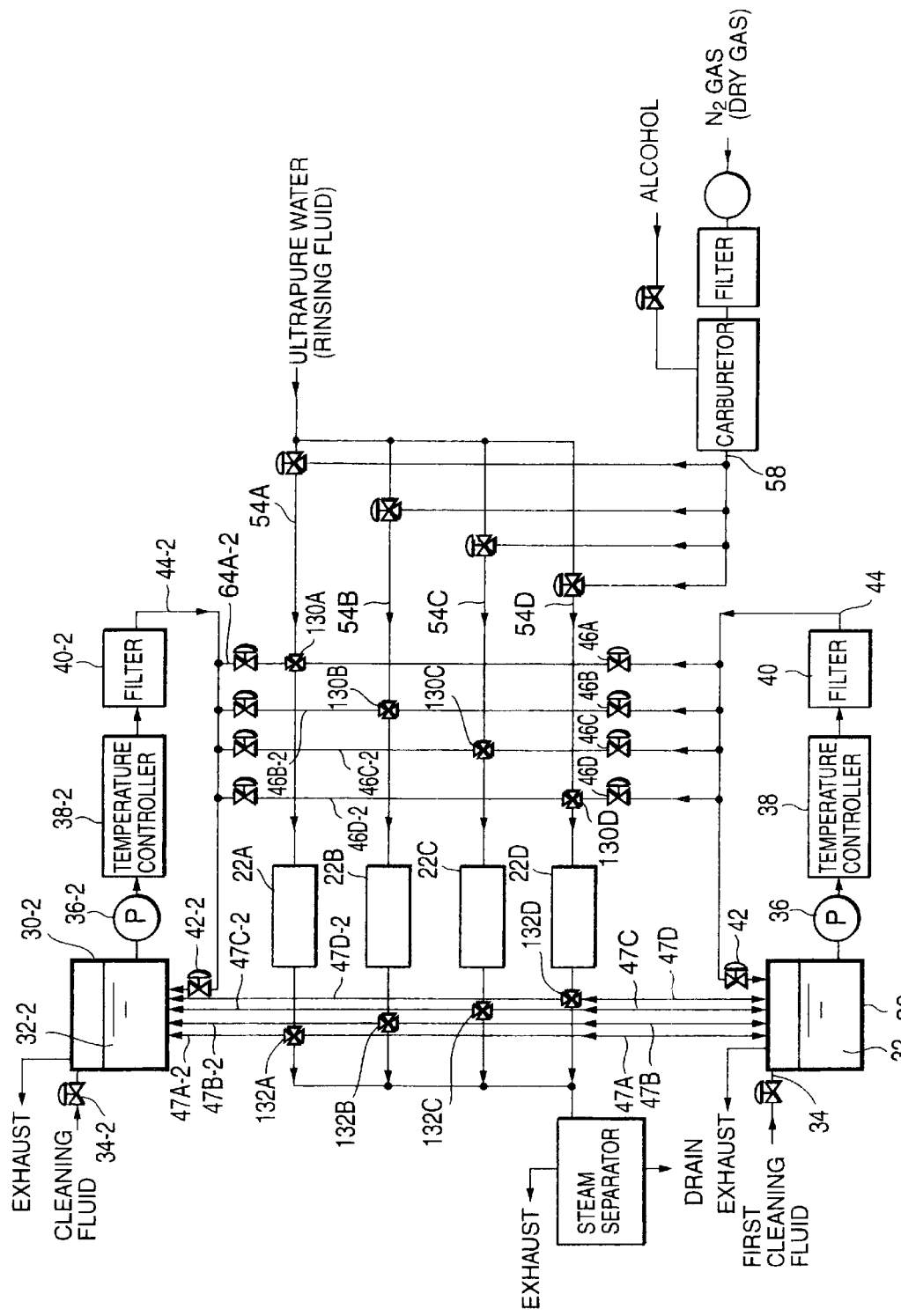
FIG. 8 is a block diagram of a modified example of a cleaning system according to the present invention.

In addition, while one kind of cleaning fluid has been used for one cleaning device in the above described preferred embodiment, the present invention should not be limited thereto, but cleaning fluids corresponding to various deposits adhering to the surface of the object to be treated may be used. As shown in FIG. 8, a plurality of kinds, e.g., two kinds, of cleaning fluids may be used. Furthermore, the same reference numbers are given to the same parts as the elements in FIG. 2, and the descriptions thereof are omitted.

In this case, in addition to the cleaning system shown in FIG. 2, a fluid storage tank 30-2 using a second cleaning fluid, second supply lines 46A-2 through 46D-2, and second reflux lines 47A-2 through 47D-2 are provided. In addition, in place of the entrance-side three-way valves 50A through 50D in FIG. 2, entrance-side four-way valves 130A through 130D are provided to be connected to the upstream sides of the second supply lines 46A-2 through 46D-2, respectively, and the downstream sides thereof are shared by the above described first supply lines 46A through 46D.

In addition, in place of the exit-side three-way valves 52A through 52D in FIG. 2, exit-side four-way valves 132A through 132D are provided to be connected to the downstream sides of the second reflux lines 47A-2 through 47D-2. The upstream sides are shared by the first reflux lines 47A through 47D. In addition, a second cleaning fluid 32-2 is stored in a second storage tank 30-2, and a second stand-by circulating system 44-2 is sequentially provided with a second circulating pump 36-2, a second temperature controller 38-2, a second filter 40-2 and a second shut-off valve 42-2. Moreover, a second supply system 34-2 is connected to the second fluid storage tank 30-2. According to this preferred embodiment, the semiconductor wafers W are continuously cleaned by two kinds of cleaning fluids.

That is, the first cleaning fluid 32, which has been simply referred to as the cleaning fluid, is first used for carrying out the cleaning treatment as described referring to FIG. 2. Then, the recovering process using $N_2$ purge, the rinsing process using the rinsing fluid, the discharging process using $N_2$purge, and the drying process using $N_2$ gas and alcohol are carried out. Subsequently, the cleaning treatment using the second cleaning fluid 32-2 is carried out. Then, the recovering process using $N_2$ purge, the rinsing process using the rinsing fluid, the discharging process using $N_2$ purge, and the drying process using $N_2$ gas and alcohol are carried out. At this time, the switching of the first and second cleaning fluids is carried out by switching the newly provided entrance-side four-way valves 130A through 130D and exit-side four-way valves 132A through 132D.

Figure 9:
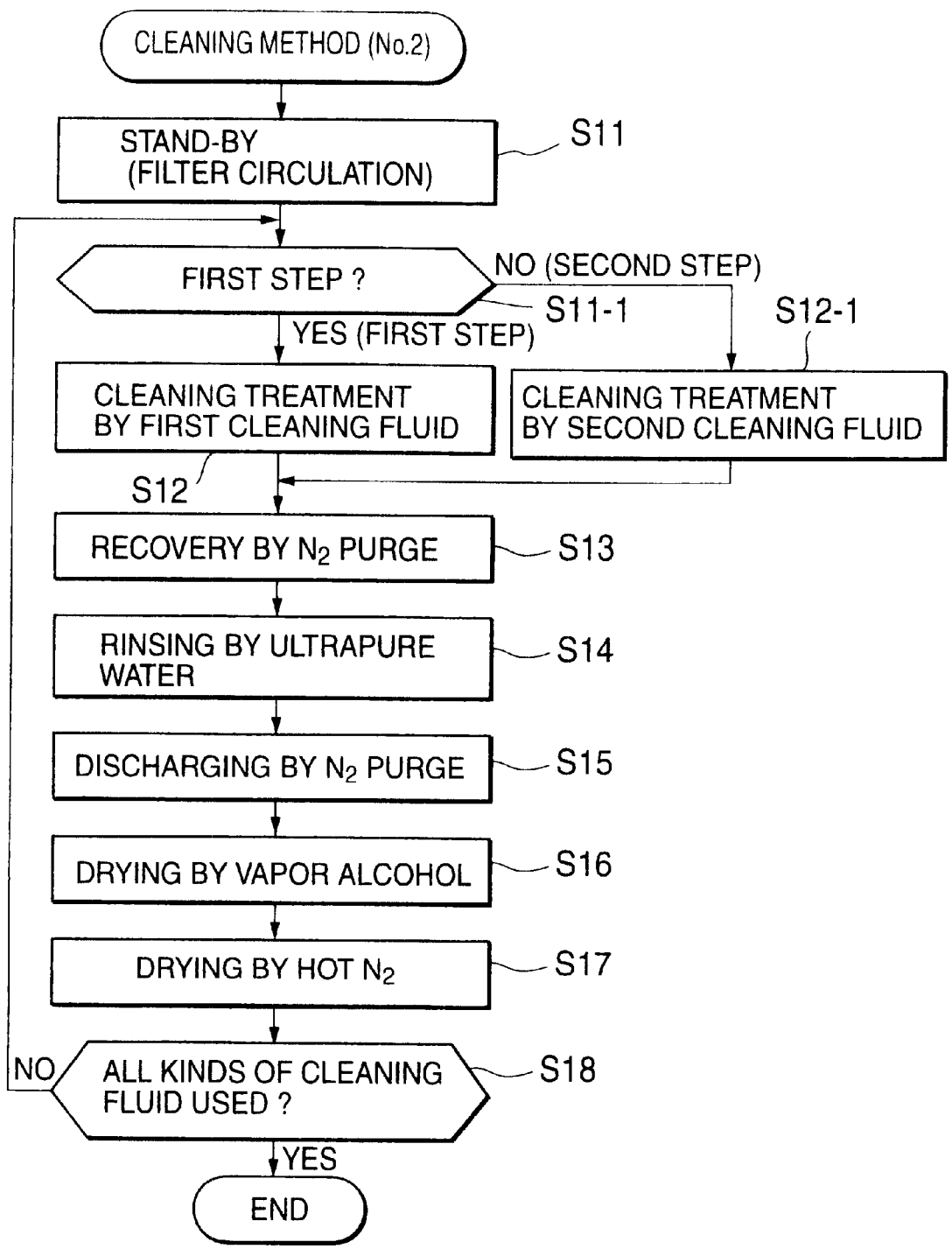
FIG. 9 is a flowchart showing a process using the cleaning system shown in FIG. 8.

The whole flow of the cleaning method in this case is shown in FIG. 9. In this figure, steps S11-1, S12-1 and S18 are added to the flow shown in FIG. 5. Furthermore, steps S11 through S17 in FIG. 9 correspond to steps S1 through S7 in FIG. 5.

First, when no cleaning treatment is carried out, the cleaning fluids 32 and 32-2 are circulated in the stand-by circulating systems 44 and 44-2, respectively (S11). Then, the cleaning treatment is started, it is first determined whether the process is a first process (S11-1). Since the fist process is first carried out, the cleaning treatment is carried out using the first cleaning fluid (S12). After the first cleaning treatment is carried out, the first cleaning fluid 32 remaining in the system is recovered by N2 purge (S13). Then, the first cleaning fluid 32 adhering to the surface of the wafer and so forth is washed away by rinsing using ultrapure water (S14), and the rinsing fluid remaining in the system is discharged by $N_2$ purge (S15). Then, after the surface of the wafer and so forth are dried by vapor alcohol (S16), they are completely dried by allowing hot $N_2$ gas to flow (S17).

Then, it is determined whether all kinds of cleaning fluids have been used (S18). Since only the cleaning treatment using the first cleaning fluid has been completed herein, NO is determined, so that the routine returns to step S11-1.

Then, NO is determined at step S11-1 since the first process is completed, so that the cleaning treatment using the second cleaning fluid is carried out as the second process (S12-1). In this cleaning treatment, the second fluid storage tank 30-2 and the second cleaning fluid circulating systems 46A-2 through 46D-2, which have been newly added in FIG. 8, are used as described above. Thus, if the cleaning treatment using the second cleaning fluid 32-2 is completed, the treatments at steps S13 through S17 are carried out as described above. Thereafter, YES is determined at step S18 since all kinds of cleaning fluids have been used, so that the treatment is completed.

Figure 10:
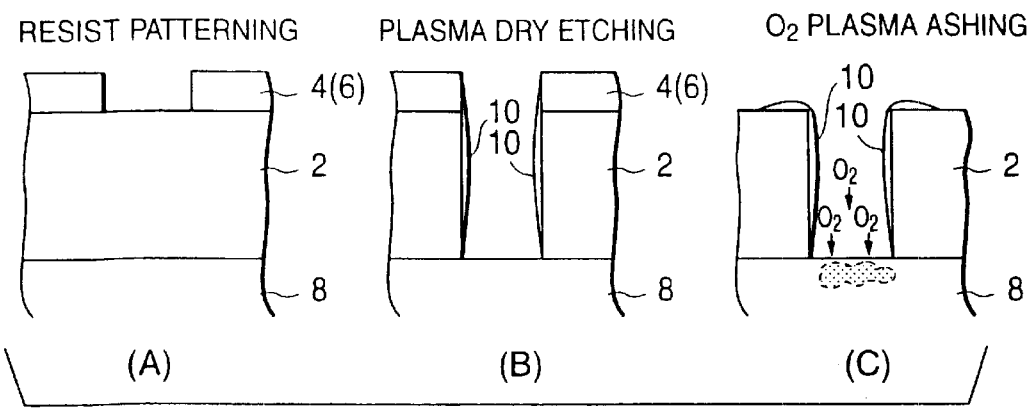
FIGS. 10(A), 10(B) and 10(C) are schematic diagrams for explaining a conventional etching process.
Figure 11:
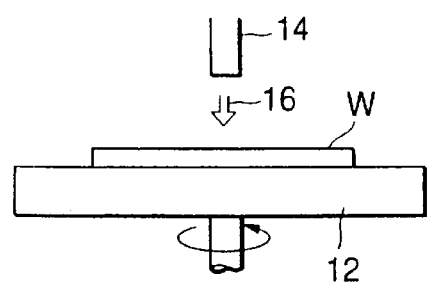
FIG. 11 is a schematic diagram showing an example of a conventional cleaning device.

Thus, according to this preferred embodiment, the cleaning treatments can be continuously carried out by two kinds of different cleaning fluids 32 and 32-2 without mixing these cleaning fluids. Such a continuous cleaning treatment using two kinds of cleaning fluids 32 and 32-2 can remove the resist mask 6 and side-wall protection layer 10, which have been used during the plasma dry etching, without having a bad influence on the underlying metal film 8 as described referring to, e.g., FIG. 10. That is, a side-wall protection layer removing step of removing the side-wall protection layer 10 is first carried out using the first cleaning fluid 32, and a resist removing step of removing the resist mask 6 is carried out using the second cleaning fluid 32-2. The first cleaning fluid 32 for use herein may be an aqueous organic alkali solution, e.g., an aqueous organic amine solution.

In particular, the aqueous organic amine solutions may include an aqueous monoethanol amine solution and an aqueous trimethyl ammonium hydride solution. For example, the aqueous organic amine solution may be ELM-C30 (trade name) commercially available from Mitsubishi Gas Chemical Co., Ltd., or the like. When ELM-C30 is used, the cleaning treatment may be carried out at a temperature of 23° C. for about 5 minutes. In addition, although the flow velocity in the conventional wet cleaning is about 0.5 cm/sec, the flow velocity of the first cleaning fluid 32 is set to be a high flow velocity of about 50 cm/sec, to accelerate the reaction on the surface of the wafer. Thus, it is possible to rapidly and efficiently carry out the cleaning. In addition, at this time, if the surface of the wafer is irradiated with ultrasonic waves as described above, a turbulent flow is produced in the cleaning fluid 32, or the production of the turbulent is promoted, so that it is possible to more rapidly carry out the cleaning.

In addition, the second cleaning fluid 32-2 may be an organic solvent, e.g., organic amine. For example, it may be T-106 (trade name) commercially available from Tokyo Applied Chemistry Co., Ltd. In this case, for example, the cleaning treatment may be carried out at 90° C. for about 20 minutes. Also in this case, the flow velocity of the second cleaning fluid 32-2 is a high flow velocity of about 50 cm/sec similar to the first cleaning fluid 32, and the surface of the wafer is rapidly and efficiently carried out by ultrasonic irradiation.

The order of the side-wall protection layer removing step and the resist removing step may be selected by the user. However, if the resist removing step is carried out earlier, there are the following problems. If the side-wall protection layer removing step is carried out after the resist removing step, the elimination of the fats and oils existing in the side-wall protection layer, which are to be removed at the subsequent step, is promoted by the cleaning fluid, such as organic amine, which is used at the resist removing step, so that the side-wall protection layer is hardened. For that reason, there are some cases where it is difficult to sufficiently remove the side-wall protection layer at the side-wall protection layer removing step using an aqueous organic amine solution or the like. In addition, since some reaction occurs on the surface of the resist mask during dry etching, the hardened layer is formed on the surface of the resist mask. If the resist is removed earlier, the side-wall protection layer is covered with the hardened layer, so that it is difficult to remove the side-wall protection layer. In order to avoid these problems, the resist removing step is preferably carried out after the side-wall protection layer removing step. Moreover, between the side-wall protection layer removing step and the resist removing step, it is required to sufficiently remove and dry the first cleaning fluid 32-2, i.e., to carry out $N_2$ purge, supply a rinsing fluid and sufficiently dry the rinsing fluid. Because, if water components contained in the first cleaning fluid 32-2 and ultrapure water serving as the rinsing fluid are mixed in the organic amine used at the resist removing step, the solution becomes alkaline, so that it is difficult to carry out a desired treatment.

Thus, if the wet cleaning treatment is carried out using the two kinds of cleaning fluids 32 and 32-2 by means of the system according to the present invention, it is possible to rapidly and simply remove the side-wall protection layer 10, which has adhered during the plasma dry etching, and the resist mask 6, which has been used as a mask, without damaging the underlying metal film 8 by oxidation and so forth. When the surface of the wafer thus cleaned was confirmed by means of an electron microscope, it was confirmed that the side-wall protection layer and the resist mask were completely removed and that the underlying copper film was not damaged.

In addition, by adopting such a cleaning method, it is possible to reduce the number of all steps of the etching process, so that it is possible to reduce the costs. In particular, when the underlying film is a copper film, this is particularly effective since this is not oxidized.

Figure 14:
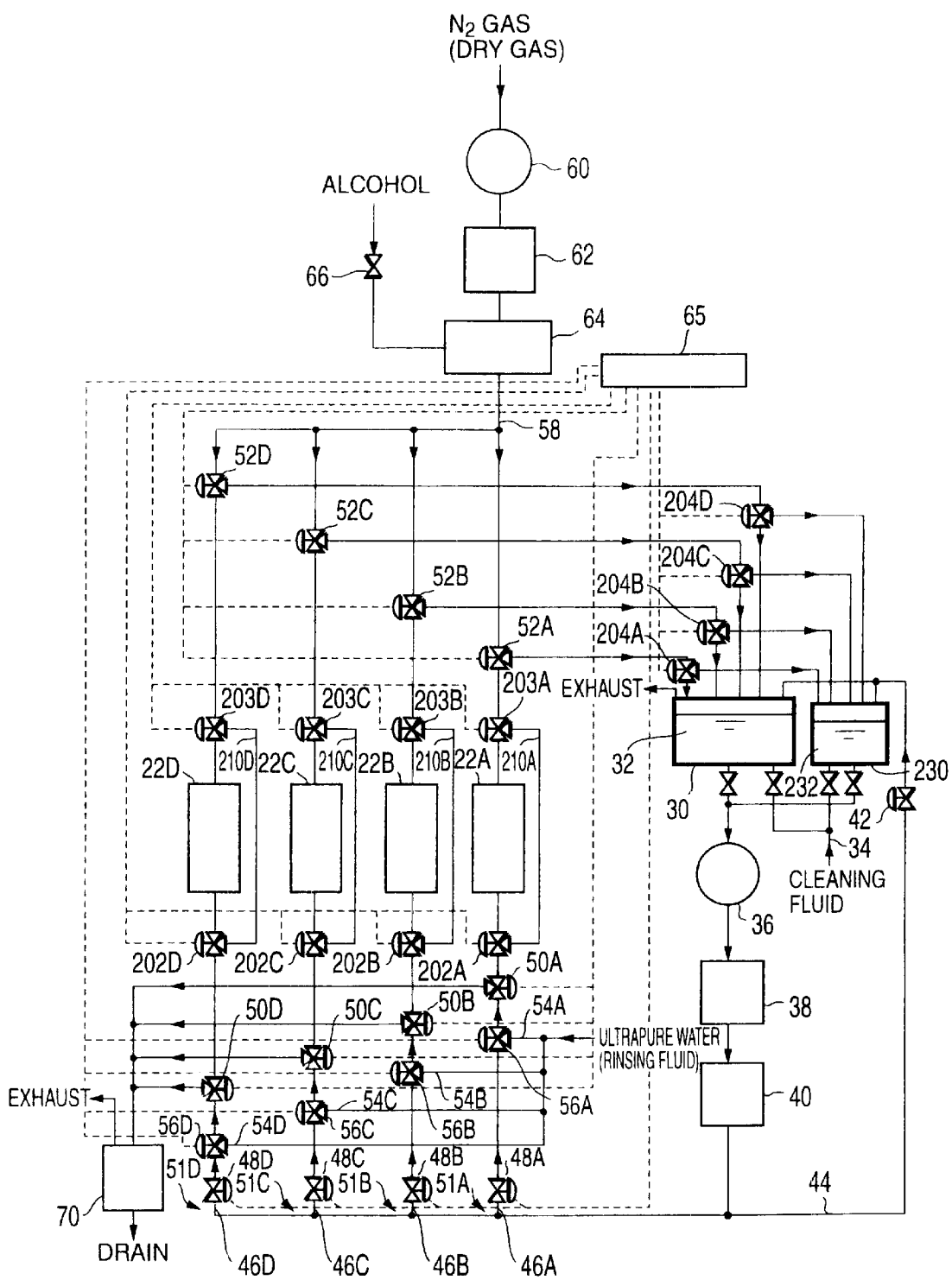
FIG. 14 is a block diagram of a part of another example of the cleaning system shown in FIG. 1.

Referring to FIG. 14, another preferred embodiment of the present invention will be described below. While the cleaning devices 22A through 22D have been arranged horizontally in the preferred embodiment shown in FIG. 2, the cleaning devices 22A through 22D are arranged vertically in the preferred embodiment shown in FIG. 14.

In addition, in this preferred embodiment unlike the preferred embodiment shown in FIG. 2, a residual liquid treating/circulating passage for cleaning a residual liquid, which remains in the piping at the last step, before the next step is formed. This preferred embodiment will be described in detail below. Furthermore, the same reference numbers are given to the same parts as the elements in FIG. 2, and the descriptions thereof are omitted.

In this preferred embodiment, the cleaning devices 22A through 22D are arranged vertically, and the cleaning container 72 is rotated by 90 degrees from the state shown in FIG. 3 In addition, the cleaning fluid inlet 74 is arranged on the lower side, and the fluid outlet 76 is arranged on the upper side. The wafers W are held in the treating space S in vertical directions.

In FIG. 14, a fluid storage tank 230 for storing a cleaning fluid 232 for treating a residual liquid is provided in addition to the fluid storage tank 30. Similar to the fluid storage tank 30, the fluid storage tank 230 is also closed. To the inlet and outlet sides of the respective cleaning devices 22A through 22D, bypass pipes 210A, 210B, 210C and 210D for forming residual liquid treating/circulating passages are connected. The residual liquid treating cleaning fluid 232 stored in the fluid storage tank 230 is bypassed without flowing through the treating space S of each of the cleaning devices 22A through 22D, and flows through the bypass pipes 210A, 210B, 210C and 210D.

Liquids, such as the cleaning fluid 32 stored in the fluid storage tank 30, ultrapure water (rinsing fluid), and the cleaning fluid stored in the fluid storage tank 230, are allowed to flow through the cleaning devices 22A through 22D from the bottom to the top, and gases, such as $N_2$ gas (dry gas), are allowed to flow through the cleaning devices 22A through 22D from the top to the bottom. By causing the fluid, such as the cleaning fluid, to flow through the cleaning devices 22A through 22D from the bottom to the top, it is possible to discharge gas in the cleaning devices 22A through 22D from the top outlet to reasonably form the laminar flow of the cleaning fluid 32. In addition, by causing gas, such as $N_2$ gas (drying gas) to flow the cleaning devices 22A through 22D from the top to the bottom, the falling of the liquid, which adhere to the wafer W or remains in the treating space S, downwards due to gravity can be accelerated to efficiently carry out the removal, recovery and drying of the liquid.

The bypass pipes 210A, 210B, 210C and 210D are connected to the supply lines 46A through 46D on the inlet sides of the cleaning devices 22A through 22D by means of three-way valves 202A, 202B, 202C and 202D, respectively, and to the supply lines 46A through 46D on the outlet sides of the cleaning devices 22A through 22D by means of three-way valves 203A, 203B, 203C and 204D.

Above the fluid storage tank 30 and the fluid storage tank 230, three-way valves 204A, 204B, 204C and 204D are provided for selectively allowing one of the cleaning fluid 32 and the residual liquid treating cleaning fluid 232 to flow.

Similar to the three-way valves 50A though 50D and the three-way valves 52A through 52D, the three-way valves 202A through 202D, 203A through 203D, and 204A through 204D are controlled by the supply control means 65.

Each of the cleaning fluid 32 and the residual liquid treating cleaning fluid 232 flows from and in the fluid storage tank 30 and the fluid storage tank 230 via two-way valves which can be controlled by the supply control means 65.

The treatment of the residual liquid will be described below. If the treating liquid used at the last step remains in the piping, there are some cases where the remaining liquid has a bad influence on the next step. Therefore, before the next step, the residual liquid treating cleaning fluid 232 is allowed to flow through the residual liquid treating/circulating passage to clean the residual liquid. The residual liquid treating/circulating passage is formed as a closed circulating passage. In this case, the three-way valves 202A through 202D, 203A through 203D and 204A through 204D, the three-way valves 50A through 50D, and the three-way valves 52A through 52D are controlled by the supply control means 65, and the residual liquid treating/circulating passages are formed so that the residual liquid treating cleaning fluid 232 in the fluid storage tank 230 sequentially flows through the three-way valves 56A through 56D, the three-way valves 50A through 50D, the three-way valves 202A through 202D, the bypass pipes 210A through 210D, the three-way valves 203A through 203D, the three-way valves 52A through 52D and the three-way valves 204A through 204D. By thus introducing the residual liquid treating cleaning fluid 232 into the bypass pipes 210A through 210D without being supplied into the cleaning space S, it is possible to suitably remove the liquid without having the influence of the residual liquid on the treatment of the wafer.

In this preferred embodiment, as described above, the cleaning fluid circulating lines 51A, 51B, 51C and 51D for circulating the cleaning fluid 32 between the fluid storage tank and the cleaning devices 22A through 22D without exposing the cleaning fluid 32 to outside air are formed by the supply lines 46A through 46D and the reflux lines 47A through 47D. Thus, since the cleaning fluid circulating lines 51A, 51B, 51C and 51D are circulating lines, there are some cases where the residual liquids are collected in the details, such as joints of piping and valves, even if the drying treatment is carried out after rinsing. These residual liquids change the concentration of the cleaning fluid 32 during the subsequent cleaning treatment, so as to influence the treatment. In order to solve this problem, according to this preferred embodiment, the residual liquid treating/circulating passage can be formed to clean the residual liquid by the residual liquid treating cleaning fluid 232, so that it is possible to solve the problem caused in relation to the fact that the cleaning fluid circulating lines 51A, 51B, 51C and 51D are formed as circulating lines. As the residual liquid treating cleaning fluid 232, the same treating fluid as the cleaning fluid 32 used during the subsequent cleaning treatment is used. That is, after the rinsing and drying treatments are carried out, the same treating fluid as the cleaning fluid 32 is supplied as the residual liquid treating cleaning fluid 232 to remove the residual liquid in the piping and to substitute the cleaning fluid 32 for the residual liquid, and thereafter, the cleaning fluid 32 is supplied into the treating space S to carry out the cleaning treatment. When a plurality of kinds of cleaning fluids 32 are used for carrying out the cleaning treatment, the same plurality of kinds of residual liquid treating cleaning fluids 232 as those of the cleaning fluids 32 may be prepared. In addition, while the residual liquid treating cleaning fluid 232 has been circulated similar to the cleaning fluid 32, it may be wasted from the piping after cleaning without being circulated.

Figure 15:
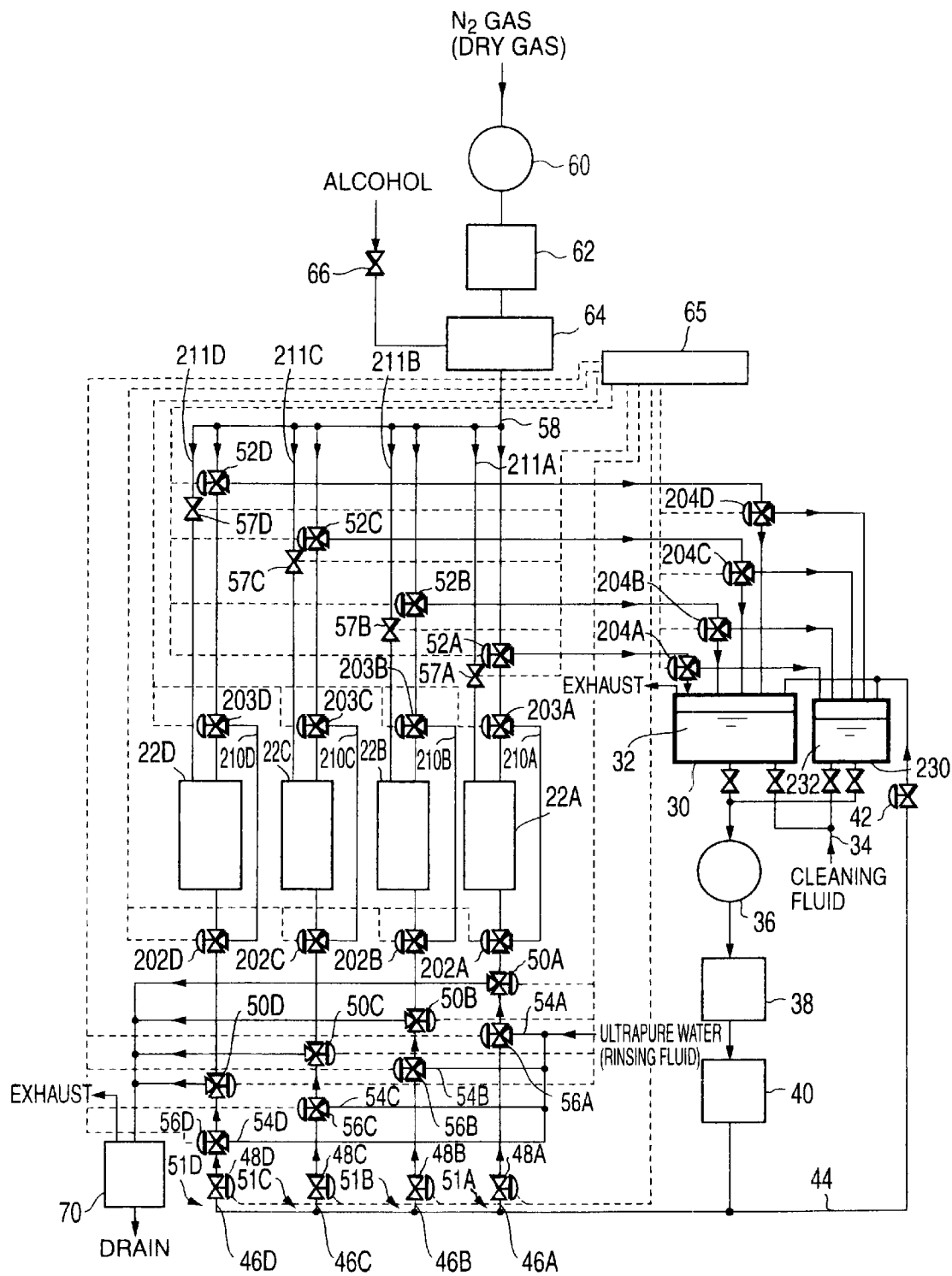
FIG. 15 is a block diagram of a part of another example of the cleaning system of FIG. 1.
Figure 16:
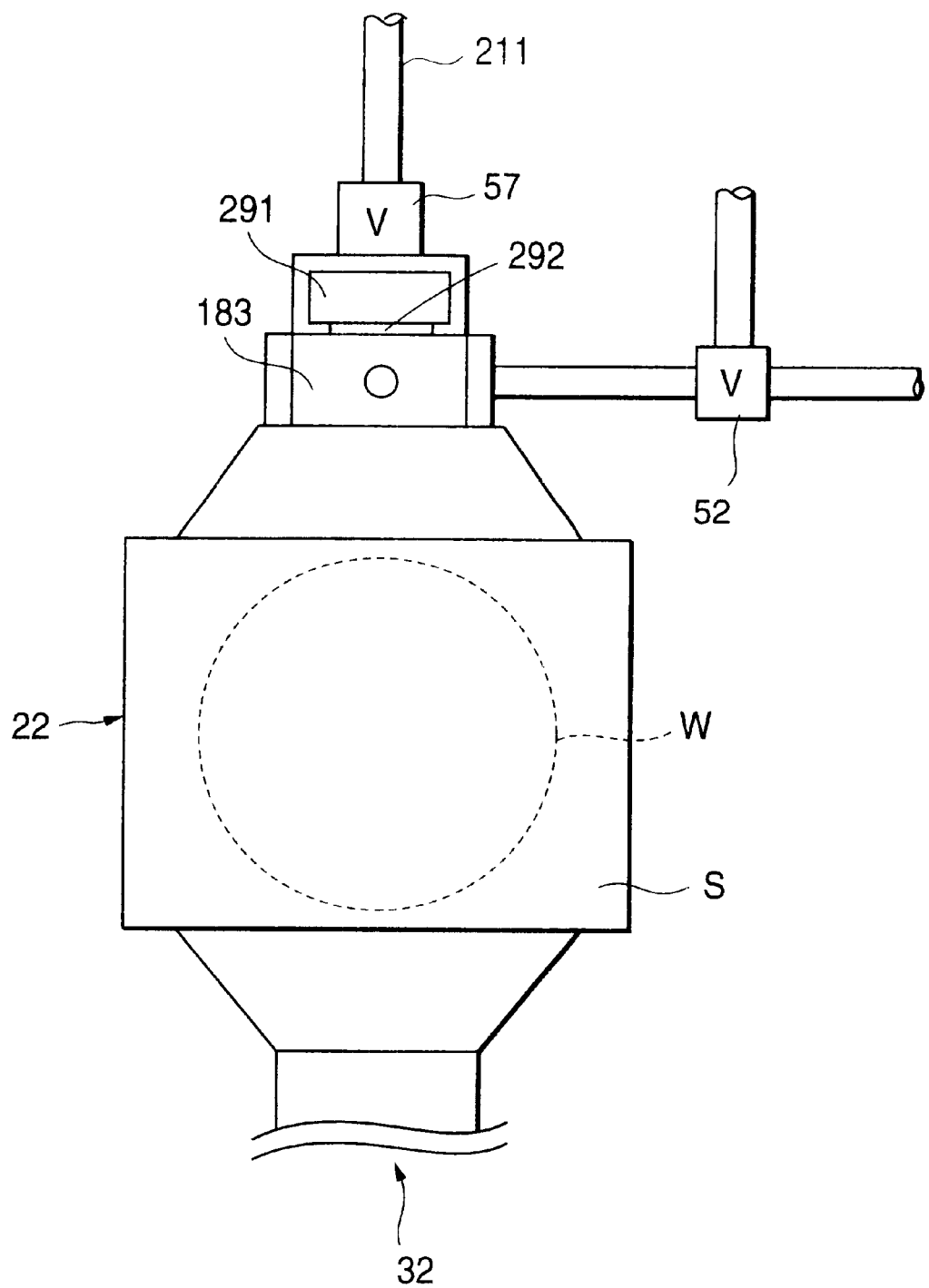
FIG. 16 is a diagram for explaining the cleaning system of FIG. 15.

Referring to FIGS. 15 and 16, the third preferred embodiment of the present invention will be described below. The main feature of this preferred embodiment is that pipes 211A, 211B, 211C and 211D only for drying, which are provided with two-way valves 57A, 57B, 57C and 57D, respectively, are added. The same reference numbers are given to the same parts as the elements in the above described preferred embodiment.

The pipes 211A through 211D only for drying branch from a portion near the source of the drying fluid upstream of the three-way valves 52A through 52D of the drying fluid supply system 58 to be communicated directly with the cleaning devices 22A through 22D, respectively. The two-way valves 57A through 57D are provided in the middle of the pipes 211A through 211D only for drying to be controlled by the supply control means 65.

In the case of the drying treatment when the pipes 211A through 211D only for drying, the drying in the treating space S and the drying in the pipes are carried out by supplying the drying fluid from different pipes. That is, the pipes 211A through 211D only for drying are used only for introducing the drying fluid into the treating space S. On the other hand, the drying in the pipes is carried out by controlling the valves so that the drying fluid sequentially flows through the three-way valves 52A through 52D, the three-way valves 203A through 203D, the bypass pipes 210A through 210D and the three-way valves 202A and 202B. If the drying treatment in the pipes and the drying treatment in the treating space S are carried out in the same line, there is the possibility that the rinsing liquid existing in the pipes is introduced into the treating space S to splash the surface of the wafer to residual as water marks after drying to deteriorate the yields. However, if the supply of the drying fluid into the treating space S is carried out using the pipes 211A through 211D only for drying as this preferred embodiment, it is possible to inhibit the water marks from being produced after drying.

The front view of the third preferred embodiment of a cleaning device according to the present invention is shown in FIG. 16. Similar to the second preferred embodiment, the cleaning device 22 is arranged vertically, the drying fluid is supplied from the pipe 211 only for drying, which is connected to the top, and the cleaning fluid 32 and the rinsing fluid are supplied from the bottom. In addition, the cleaning fluid 32 and so forth are discharged from the pipes, which are connected to the top discharging pipe 183, via the three-way valve 52. Furthermore, the bypass pipe 210 and the three-way valve 203 are not shown.

Between the discharging pipe 183 and the two-way valve 57 provided in the pipe 211 only for drying, an intermediate chamber 291 is formed. The intermediate chamber 291 and the discharging pipe 183 are communicated with a slit 292. However, since the cross-sectional area of the pipe for discharging the cleaning fluid and so forth is sufficiently greater than the slit 292, liquid hardly enters the intermediate chamber 191 via the slit. If the cleaning fluid 32 adheres to the two-way valve 57, there is a problem in that bubbles in the cleaning fluid 32 enter the valves, so that the subsequent rinsing treatment is not sufficiently rinsed. If the treatment is continued while bubbles remain being collected in the valves, the bubbles adhere to the wafer during the drying treatment to cause serious defects. However, the cleaning fluid 32 hardly adheres to the two-way valve 57 by providing the intermediate chamber 291, so that this problem can be solved. Moreover, by supplying a very small amount of drying fluid from the pipe 211 only for drying to the intermediate chamber 291 during the cleaning and rinsing treatments, it is possible to prevent the liquid from entering the intermediate chamber 291. In addition, since the cleaning fluid 32 slightly adheres to the slit 292, a discharging line for discharging the rinsing fluid is provided on the side of the intermediate chamber 291, and the cleaning fluid 32 is discharged from the line of the discharging pipe 183. Thus, the cleaning fluid 32 adhering to the slid 292 can be removed, so that it is possible to more suitably carry out the treatment.

Figure 17:
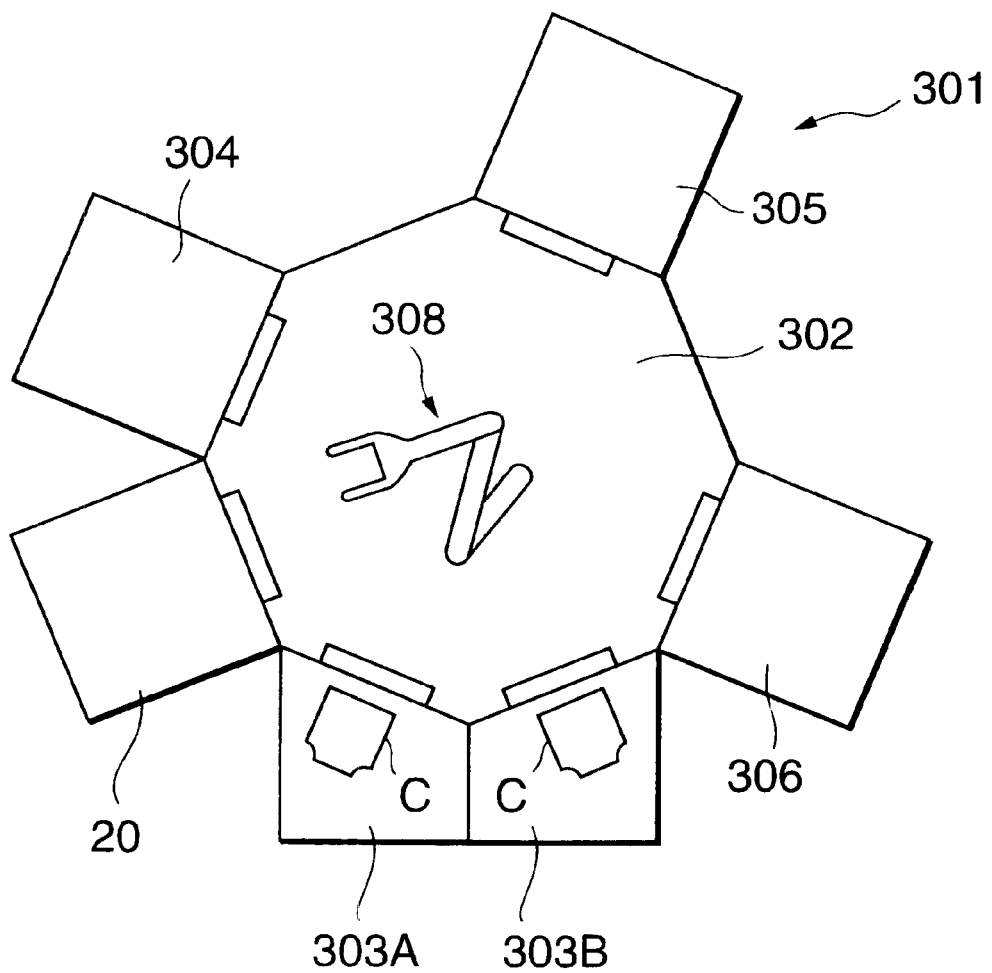
FIG. 17 is a plan view of a treating device, in which a cleaning device is incorporated as a part.

Referring to FIG. 17, a substrate treating device 301 having the cleaning device 20 will be described below. As described above, since the cleaning device 20 is formed with the closed cleaning fluid circulating line, a series of continuous thin-film deposition steps including a cleaning step can be carried out without exposing the wafer W to outside air.

FIG. 17 is a plan view schematically showing the whole construction of the substrate treating device 301. In the figure, reference number 302 denotes a transfer chamber 302. The transfer chamber 302 comprises an octagonal prismatic air-tight chamber. In the wide walls of this transfer chamber 302, two transfer ports for introducing/discharging wafers W serving as objects to be treated are formed. Two air-tight cassette chambers 303A and 303B, in each of which a wafer cassette C is mounted, are air-tightly connected to the transfer chamber 302. The cassette chambers 303A and 303B serve as load-lock chambers which are air-tightly connected to the transfer chamber 302 for introducing/discharging the wafers W into/from the outside. The wafer cassette C is a container for housing 25 wafers W. The top of each of the cassette chambers 303A and 303B is provided with a lid which can be open and closed forwards and rearwards for introducing and discharging the cassette C. In addition, a lifting mechanism for intermittently vertically moving the cassette C is provided in each of the cassette chambers 303A and 303B. Moreover, an exhaust pipe is connected to the bottom of each of the cassette chambers 303A and 303B. This exhaust pipe is connected to a vacuum pump, e.g., a dry pump, via a valve.

The transfer chamber 302 is formed with four wafer transferring ports on the side walls thereof. Three vacuum treating chambers 304, 305, 306 and the cleaning chamber 20 are air-tightly connected to the transfer chamber 302 via the wafer transferring ports. In the transfer chamber 302, a transfer means 308 for transferring the wafers W between the vacuum treating chambers 304, 305, 306 and the cleaning device 20 is provided. The transferring means 308 comprises an articulated arm having three transfer arms which are independently rotated in horizontal directions.

The vacuum treating chamber 304 is an oxidation chamber for forming an oxide film on the surface of the wafer W. The vacuum treating chamber 305 is an etching chamber for etching the oxide film formed in the oxidation chamber 304. The vacuum treating chamber 306 is an ashing chamber for ashing the wafer W etched in the etching chamber 305. The wafer W ashed in the ashing chamber 306 is fed to the cleaning device 20 without being exposed to outside air, to be cleaned therein. After cleaning, the wafer W is returned from the cleaning device 20 to the transfer chamber 302. Thereafter, other required treatments are carried out, and the wafer W is transferred to the cassette chambers 303A and 304B. In addition, the transferring of the wafer to the cleaning device 22 and the cleaning treatment may be carried out after the etching treatment without providing the ashing treating chamber 306.

According to this preferred embodiment, the cleaning device 20 has the closed cleaning fluid circulating line, and the cleaning device 20, together with the air-tight chamber, is air-tightly connected to the transfer chamber 302, so that it is possible to consistently carry out the thin-film deposition without exposing the wafer W to outside air.

While the thin-film deposition device has been described in the above described preferred embodiment, the present invention should not be limited thereto. If it is desired to carry out a treatment without exposing wafers W to outside air, the invention may be applied to other treatments, e.g., exposure treatments.

As described above, according to the cleaning device, cleaning system, treating device and cleaning method of the present invention, the following excellent effects can be obtained.

When the cleaning fluid is allowed to flow into the cleaning container to clean the surface of the object to be treated, the cleaning treatment can be rapidly and efficiently carried out without exposing the cleaning fluid to outside air. In addition, air does not enter the treating container, it is possible to prevent the cleaned metal wiring layer, such as the copper film, from being oxidized. In other words, it is possible to efficiently use the cleaning fluid by circulating the cleaning fluid, and it is possible to prevent the cleaning fluid from being deteriorated due to oxidation and vaporization since the cleaning fluid is used in the closed state without contacting air.

It is also possible to efficiently use the cleaning fluid, and it is possible to continuously carry out the rinsing and drying of the object to be treated, in the same device.

In addition, cleaning fluids having different functions can be supplied into the cleaning device without being mixed with each other to continuously carry out treatments, e.g., to continuously clean and remove the resist mask and side-wall protection layer on the surface of the semiconductor wafer after the plasma etching.

In addition, it is also possible to allow the cleaning fluid to smoothly flow to uniformly carry out the treatment, and it is possible to reduce the influence of the immobile layer, which is produced on the surface of the object due to the viscosity of the chemical by the turbulent flow, to rapidly and efficiently carry out the cleaning treatment.

It is also possible to reduce the occupied floor area to greatly reduce the foot print.

Moreover, it is possible to rapidly and simply remove both of the side-wall protection layer and the resist mask, which adhere to the surface of the wafer, by continuous wet cleaning treatments. In addition, by carrying out the cleaning treatment in this order, it is possible to avoid the hardening of the side-wall protection layer, which can occur when the treatments are carried out in the opposite order, and unexpected accidents, such as the covering of the side-wall protection layer with the hardening layer which can be formed on the surface of the resist mask.

Since it is possible to form the residual liquid treating/circulating passage to clean the residual liquid by the residual liquid treating cleaning liquid, it is possible to prevent the presence of the residual liquid remaining in the piping at the last step from having the influence on the next step even if the cleaning fluid circulating line is formed as a circulating line.

In addition, by combining the cleaning device having the closed cleaning fluid circulating line with the vacuum treating device and so forth in the form of a cluster, it is possible to carry out a series of consistent treating steps including a cleaning step without exposing the wafer W to outside air.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A cleaning device comprising:
    a cleaning container, in which a treating space for housing an object to be treated is formed;
    a fluid storage tank for storing a cleaning fluid for treating said object;
    a supply line for supplying said cleaning fluid from said fluid storage tank to said cleaning container; and
    a reflux line for returning said cleaning fluid from said cleaning container to said fluid storage tank,
    wherein said cleaning container, said fluid storage tank, said supply line and said reflux line are associated with each other for forming a closed cleaning fluid circulating line, and
    wherein a cross-sectional area of said treating space perpendicular to a direction of a flow of said fluid crossing on said object is predetermined times as large as the maximum value of the cross sectional area of said object perpendicular to said direction,
    wherein said predetermined times is in the range of from about 1.5 times to about 300 times,
    wherein said object is a plate, and which further comprises fluid guiding means for allowing said cleaning fluid to flow in parallel to the surface of said plate, and
    wherein said fluid guiding means has a divergent flat cleaning fluid introducing part connected to a fluid inlet of said cleaning container, and a convergent flat cleaning fluid discharging part connected to a fluid outlet of said cleaning container.

2. A cleaning device as set forth in claim 1, which further comprises a recovering fluid supply system for supplying a recovering fluid to said cleaning container without exposing said recovering fluid to outside air, to recover said cleaning fluid in said fluid storage tank.

3. A cleaning device as set forth in claim 1, which further comprises:
    a rinsing fluid supply system for supplying a rinsing fluid to said cleaning container without exposing the rinsing fluid to outside air;
    a dry fluid supply system for supplying a dry fluid to said cleaning container without exposing the dry fluid to outside air; and
    supply control means for controlling so as to selectively continuously supply one of said fluids to said cleaning container every kind of said fluids.

4. A cleaning device as set forth in claim 3, wherein said rinsing fluid supply system and said drying fluid supply system are connected to said cleaning fluid circulating line, and said rinsing fluid and said drying fluid are supplied to said cleaning container via said cleaning fluid circulating line.

5. A cleaning device as set forth in claim 4, which further comprises a second fluid storage tank for storing a residual liquid treating cleaning fluid for substituting said cleaning fluid for said rinsing fluid remaining in said cleaning fluid circulating line, and wherein a closed residual liquid treating/circulating line is formed for allowing said residual liquid treating cleaning fluid to flow through said cleaning fluid circulating line without exposing said residual liquid treating cleaning fluid to outside air, to recover said residual liquid treating cleaning fluid in said second fluid storage tank.

6. A cleaning device as set forth in claim 5, wherein said residual liquid treating/circulating passage is provided with a bypass pipe for bypassing said cleaning container to allow said residual liquid treating cleaning fluid to flow.

7. A cleaning device as set forth in claim 6, which further comprises a pipe only for a drying fluid is provided for supplying only the drying fluid to said cleaning container.

8. A cleaning device as set forth in claim 1, wherein said fluid storage tank comprises a plurality of storage tanks for storing cleaning fluids corresponding to a plurality of kinds of deposits, respectively, which adhere to the surface of said object to be treated.

9. A cleaning device as set forth in claim 1, which further comprises turbulent flow forming means for promoting the formation of a turbulent flow in said cleaning fluid passing through said cleaning container.

10. A cleaning device as set forth in claim 9, wherein said turbulent flow forming means is a sound wave radiating unit for irradiating the surface of said object with sound waves.

11. A cleaning device as set forth in claim 10, wherein said sound wave radiating unit comprises an ultrasonic element for producing ultrasonic waves, and a buffer tank for propagating the ultrasonic waves produced by said ultrasonic element.

12. A cleaning device as set forth in claim 9, wherein said turbulent flow forming means comprises an irregular portion provided on an inner wall surface of said cleaning container.

13. A cleaning system wherein a plurality of cleaning devices as set forth in claim 1 are arranged in one of vertical, lateral and longitudinal directions.

14. A treating device comprising:
- a transfer chamber capable of being maintained air-tightly;
- a load-lock chamber which is air-tightly connected to said transfer chamber for introducing/discharging an object to be treated, into/from the outside;
- at least one vacuum treating chamber which is air-tightly connected to said transfer chamber via a transfer port;
- a cleaning chamber which is air-tightly connected to said transfer chamber via a transfer port;
- transfer means, provided in said transfer chamber, for transferring said object between said load-lock chamber, said vacuum treating chamber and said cleaning device, said cleaning device comprising:
- a cleaning container, in which a treating space for housing an object to be treated is formed;
- a fluid storage tank for storing a cleaning fluid for treating said object;
- a supply line for supplying said cleaning fluid from said fluid storage tank to said cleaning container; and
- a reflux line for returning said cleaning fluid from said cleaning container to said fluid storage tank, wherein said cleaning container, said fluid storage tank, said supply line and said reflux line are associated with each other for forming a closed cleaning fluid circulating line, and wherein a cross-sectional area of said treating space perpendicular to a direction of a flow of said fluid crossing on said object is in a range of from about 1.5 times to about 300 times as large as the maximum value of the cross sectional area of said object perpendicular to said direction.

* * * * *

UNITED STATES PATENT AND TRADEMARK OFFICE
CERTIFICATE OF CORRECTION

PATENT NO.     : 6,478,035 B1
DATED          : November 12, 2002
INVENTOR(S)    : Niuya et al.

It is certified that error appears in the above-identified patent and that said Letters Patent is hereby corrected as shown below:

<u>Title page,</u>
Item [*] Notice: Subject to any disclaimer, the term of this patent is extended or adjusted under 35 USC 154(b) by (59) days
Delete the phrase "by 59 days" and insert -- by 128 days --

Signed and Sealed this

Twenty-fifth Day of November, 2003

JAMES E. ROGAN
*Director of the United States Patent and Trademark Office*